(12) United States Patent
Hirose et al.

(10) Patent No.: US 11,873,560 B2
(45) Date of Patent: Jan. 16, 2024

(54) ABNORMALITY DETECTION SYSTEM AND CONTROL BOARD

(71) Applicant: Tokyo Electron Limited, Tokyo (JP)

(72) Inventors: Katsuhito Hirose, Yamanashi (JP); Toshio Hasegawa, Yamanashi (JP); Shohei Yoshida, Yamanashi (JP); Takeshi Shinohara, Yamanashi (JP); Shinji Kawasaki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1301 days.

(21) Appl. No.: 16/088,102

(22) PCT Filed: Mar. 15, 2017

(86) PCT No.: PCT/JP2017/010496
§ 371 (c)(1),
(2) Date: Sep. 25, 2018

(87) PCT Pub. No.: WO2017/169804
PCT Pub. Date: Oct. 5, 2017

(65) Prior Publication Data
US 2020/0299841 A1    Sep. 24, 2020

(30) Foreign Application Priority Data
Mar. 29, 2016  (JP) .................. 2016-066052

(51) Int. Cl.
*C23C 16/52* (2006.01)
*G05B 23/02* (2006.01)
(Continued)

(52) U.S. Cl.
CPC ........ *C23C 16/52* (2013.01); *C23C 16/45536* (2013.01); *C23C 16/45544* (2013.01);
(Continued)

(58) Field of Classification Search
CPC .............. C23C 16/52; C23C 16/45525–45555
See application file for complete search history.

(56) References Cited

U.S. PATENT DOCUMENTS

| 8,790,743 B1* | 7/2014 | Omori .............. H01J 37/32935 427/9 |
| 2002/0188367 A1* | 12/2002 | Hayashi ....................... 700/121 |
| 2007/0121267 A1* | 5/2007 | Kotani ..................... H03H 7/40 361/85 |

FOREIGN PATENT DOCUMENTS

| CN | 102856149 A | 1/2013 |
| CN | 103205734 A | 7/2013 |

(Continued)

OTHER PUBLICATIONS

International Search Report dated Jun. 6, 2017 for WO 2017/169804 A1.

*Primary Examiner* — Dah-Wei D. Yuan
*Assistant Examiner* — Stephen A Kitt
(74) *Attorney, Agent, or Firm* — Venjuris, P.C.

(57) ABSTRACT

Provided is an abnormality detection system that includes a first controller configured to control a substrate processing apparatus and a second controller configured to control a device provided in the substrate processing apparatus according to an instruction from the first controller, thereby detecting an abnormality in the device. The second controller includes a storage unit configured to collect status signals for the device for a predetermined time and at a predetermined sampling interval in a predetermined cycle and accumulate the collected status signals for the device, and the first controller includes an abnormality determination unit configured to acquire the accumulated status signals for the device from the second controller at a time interval equal to or longer than the predetermined time, and determine presence or absence of an abnormality in the device.

12 Claims, 20 Drawing Sheets

(51) Int. Cl.
*C23C 16/455* (2006.01)
*G05B 19/048* (2006.01)
*H01L 21/67* (2006.01)

(52) U.S. Cl.
CPC ....... *G05B 19/048* (2013.01); *G05B 23/0221* (2013.01); *H01L 21/67253* (2013.01); *G05B 2219/45026* (2013.01)

(56) References Cited

FOREIGN PATENT DOCUMENTS

| | | | |
|---|---|---|---|
| JP | 2013-168131 A | | 8/2013 |
| JP | 2013-196822 A | | 9/2013 |
| JP | 2015-015282 A | | 1/2015 |
| JP | 2015015282 A | * | 1/2015 |
| KR | 10-2007-0121065 A | | 12/2007 |
| WO | 2005/057993 A | | 6/2005 |

* cited by examiner

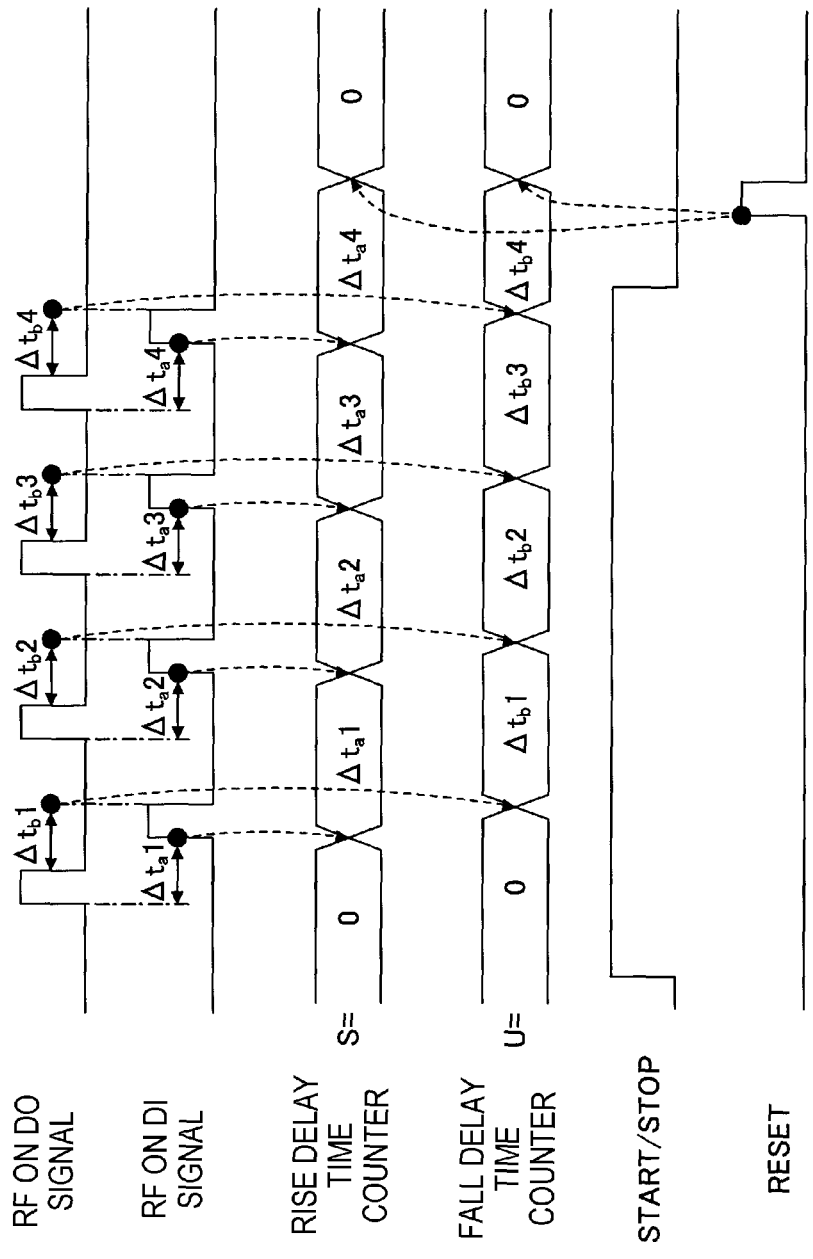

ABNORMALITY DETECTION SYSTEM AND CONTROL BOARD

CROSS REFERENCE TO RELATED APPLICATIONS

This application is a national phase of PCT application No. PCT/JP2017/010496, filed on 15 Mar. 2017, which claims priority from Japanese Patent Application No. 2016-066052, filed on 29 Mar. 2016, all of which are incorporated herein by reference.

TECHNICAL FIELD

The present disclosure relates to an abnormality detection system and a control board.

BACKGROUND

For example, Patent Document 1 discloses a controller that determines operation statuses of a plurality of valves provided in a plasma apparatus, based on a plurality of command signals for instructing opening/closing operations of the plurality of valves or a plurality of detection signals of a plurality of sensors for detecting the opening/closing operations of the plurality of valves.

In a plasma chemical vapor deposition (CVD) apparatus, a plasma control is performed in a cycle of a minute. On the other hand, a controller for controlling the plasma CVD apparatus detects a status signal of a device such as a high-frequency power supply (hereinafter, also referred to as an "RF power supply") or a valve attached to the plasma CVD apparatus in a cycle of 100 ms. That is, the controller polls the sensor or the RF power supply in a cycle of 100 ms.

PRIOR ART DOCUMENT

Patent Document

Patent Document 1: Japanese Patent Laid-Open Publication No. 2013-168131

SUMMARY OF THE INVENTION

Problem to be Solved

However, in a control for a plasma atomic layer deposition (ALD) apparatus in which a raw material gas and a reaction gas are alternately supplied into a processing vessel so as to form a thin film having a thickness of atomic level or molecular level for each layer, a plasma control is performed in a cycle of 10 ms.

Therefore, when an input/output (TO) signal of the sensor or the RF power supply is controlled in a cycle of 100 msec in the related art, it may be difficult to accurately determine the statuses of the devices such as a valve provided in the plasma ALD apparatus, and to appropriately perform a process control.

With respect to the problems described above, in an aspect, an object of the present disclosure is to accurately detect a device provided in a substrate processing apparatus.

Means to Solve the Problem

In order to solve the problems described above, according to one aspect, there is provided an abnormality detection system that includes a first controller configured to control a substrate processing apparatus and a second controller configured to control a device provided in the substrate processing apparatus according to an instruction from the first controller, thereby detecting an abnormality in the device. The second controller includes a storage unit configured to collect status signals for the device for a predetermined time and at a predetermined sampling interval in a predetermined cycle, and accumulate the collected status signals for the device, and the first controller includes an abnormality determination unit configured to acquire the accumulated status signals for the device from the second controller at a time interval equal to or longer than the predetermined time, and determine the presence or absence of an abnormality in the device.

Effect of the Invention

According to one aspect, it is possible to accurately detect the status of a device provided in a substrate processing apparatus.

BRIEF DESCRIPTION OF THE DRAWINGS

FIG. 20 is a time chart of respective signals in the abnormality detection process according to the sixth embodiment.

DETAILED DESCRIPTION TO EXECUTE THE INVENTION

Figure 1:
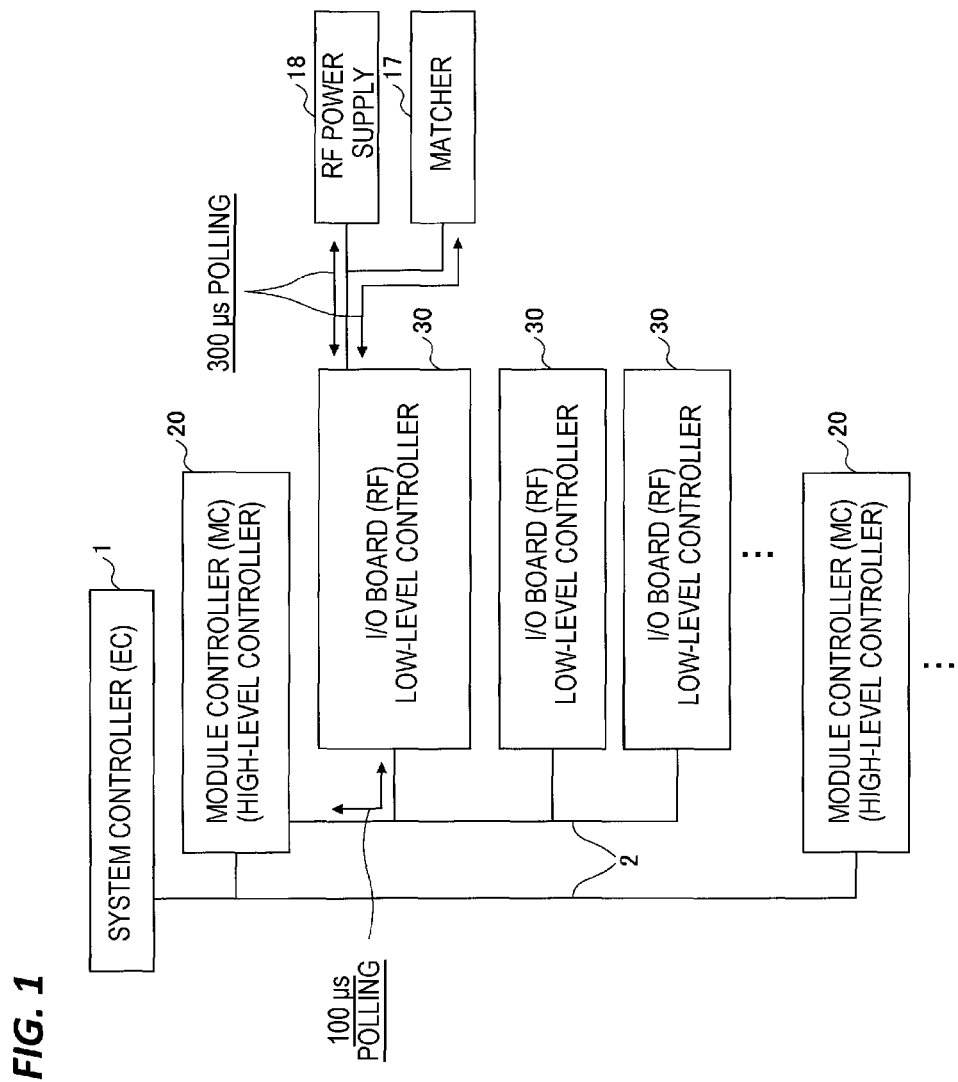
FIG. 1 is a diagram illustrating an example of a control system of a substrate processing system according to an embodiment.

Hereinafter, embodiments for executing the present disclosure will be described with reference to the drawings. Meanwhile, in the present specification and drawings, the same reference numerals are used to denote substantially the same components, and redundant descriptions will be omitted.

Example of Control System of Substrate Processing System

First, an example of a control system of a substrate processing system according to an embodiment of the present disclosure will be described with reference to FIG. 1. For example, the substrate processing system includes, for example, a plurality of substrate processing apparatuses, transfer modules (TMs), and load-lock modules (LLMs), and the processing of a plurality of substrates is executed by the plurality of substrate processing apparatuses. An equipment controller (EC) 1 is a general control unit that controls the entire substrate processing system.

The system controller 1 is connected to a plurality of module controllers (MCs) 20 via a network 2 such as a local area network (LAN) in the system. The module controllers 20 control the substrate processing apparatuses in accordance with instructions from the system controller 1.

Each module controller 20 is connected to a plurality of I/O boards 30 via the network 2 such as the local area network (LAN) in the system. The plurality of I/O boards 30 control at least one of a plurality of devices provided in the substrate processing apparatuses in accordance with instructions from respective module controllers 20. For example, as illustrated in FIGS. 1 and 2, one of the plurality of I/O boards 30 controls respective devices such as an RF power supply 18, which is an example of a high-frequency power supply, and a matcher 17.

Figure 2:
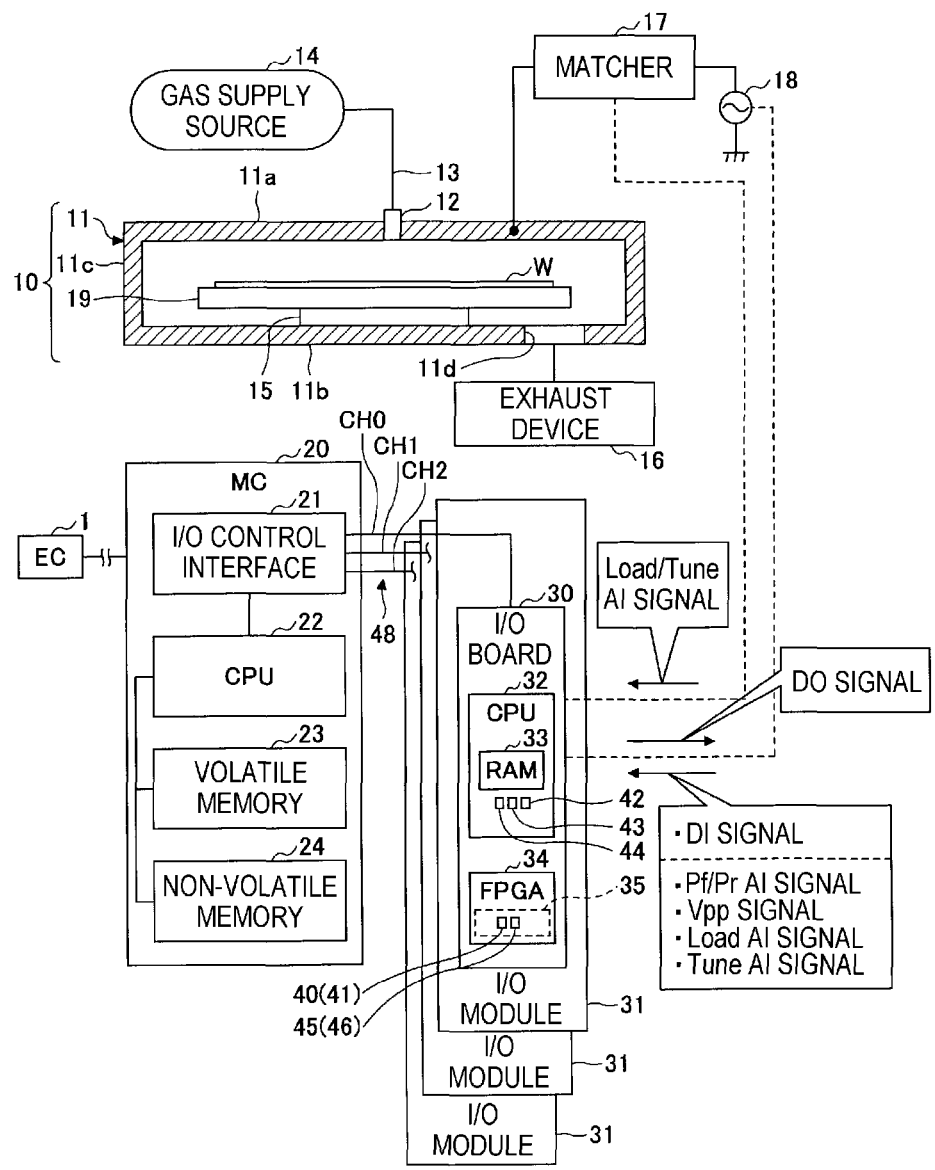
FIG. 2 is a diagram illustrating an example of hardware configurations of a substrate processing apparatus, an MC, and an I/O board according to an embodiment.

As illustrated in FIG. 2, an I/O board 30 transmits a command signal for turning ON RF (hereinafter, referred to as a "digital output (DO) signal") according to a command from a module controller (MC) 20 to the RF power supply 18. In addition, the I/O board 30 inputs an acknowledgment signal for the DO signal (hereinafter, referred to as "digital input (DI) signal") from the RF power supply 18.

In the following description, the equipment controller (EC) 1 is denoted as an EC 1 and the module controller (MC) 20 is denoted as an MC 20. The MC 20 is a high-level controller relative to the I/O board 30 and the I/O board 30 is a low-level controller relative to the MC 20. The I/O board 30 is also referred to as a control board. The high-level controller is an example of a first controller, and the low-level controller is an example of a second controller.

Hardware Configurations of Substrate Processing Apparatus, MC, and I/O Board Next, an example of hardware configurations of the substrate processing apparatus 10, the MC 20, and the I/O board 30 according to an embodiment of the present disclosure will be described with reference to FIG. 2. The substrate processing apparatus 10 may be an apparatus such as a plasma CVD apparatus, a plasma ALD apparatus, or a plasma etching apparatus. In the present embodiment, the substrate processing apparatus 10 is configured as an atomic layer deposition (ALD) apparatus that performs film formation by repeatedly supplying a plurality of gases intermittently at different timings to a semiconductor wafer W (hereinafter, simply referred to as a "wafer").

The substrate processing apparatus 10 includes a processing container 11, a gas supply source 14 configured to supply a plurality of gases used for processing the wafer W, an RF power supply 18 connected to the processing container 11 via a matcher 17 and configure to apply RF (high-frequency) electric power to the processing container 11, and an exhaust device 16.

The processing container 11 includes a ceiling wall 11a, a bottom wall 11b, and a side wall 11c connecting the ceiling wall 11a and the bottom wall 11b. The processing container 11 is formed in a substantially cylindrical shape, and the inside of the processing container 11 is hermetically sealed. An exhaust port 11d is formed in the bottom wall 11b. When the exhaust device 16 is operated, gas is exhausted from the exhaust port 11d, and the inside of the processing container 11 is decompressed to a predetermined degree of vacuum.

A stage 19 configured to hold the wafer W thereon and a cylindrical support member 15 configured to support the stage 19 thereon are disposed inside the processing container 11. Further, a gas inlet 12 is provided in the ceiling wall 11a of the processing container 11. The gas supplied from the gas supply source 14 is introduced into the processing container 11 from the gas inlet 12 through a gas supply pipe 13.

EC

The EC 1 reads a program including a recipe designated by process managers from a hard disk device or a storage medium. The read program is transmitted from the EC 1 to each MC 20. In addition, the EC 1 is connected, via a network 2 such as a LAN, to a host computer as a manufacturing execution system (MES) that manages a manufacturing process of the whole factory in which the substrate processing system is installed. The host computer feeds back real-time information about various processes in the factory to a backbone business system, and controls a process in consideration of, for example, the load of the whole factory.

A recipe relating to the overall control of the substrate processing system, the abnormality detection of the substrate processing apparatus 10, and the processing of a wafer W may be stored in, for example, a storage medium, and may be used by installing the recipe in a hard disk device. As the storage medium, for example, a CD-ROM, a hard disk, a flexible disk, a flash memory, a DVD, or the like may be used. In addition, it is also possible to use the recipe online by transmitting the recipe from another apparatus through, for example, a dedicated line at any time.

MC

A plurality of MCs 20 are collectively controlled by the EC 1. Meanwhile, the MCs 20 may be installed to correspond not only to the plurality of substrate processing apparatuses 10 in the substrate processing system, but also to load-lock modules or loader units. Even in such a case, the MCs 20 are collectively controlled by the EC 1.

Hereinafter, the configuration of the MCs 20 will be described by taking an MC 20 that controls the substrate processing apparatus 10, as an example. The MC 20 includes an I/O control interface 21, a CPU 22, a volatile memory 23 configured with, for example, a RAM, and a nonvolatile memory 24 configured with, for example, a ROM. The nonvolatile memory 24 is configured with a nonvolatile memory such as static random-access memory (SRAM), magnetoresistive random access memory (MRAM), electrically erasable programmable read-only memory (EEPROM), or flash memory. The nonvolatile memory 24 stores various kinds of log information in the substrate processing apparatus 10, for example, a log of status signals in the case where an abnormality in the substrate processing apparatus 10 is determined. The information stored in the nonvolatile memory 24 as status signals includes various kinds of signals input and output between the MC 20 and the I/O board 30 (e.g., a digital output (DO) signal, a digital input (DI) signal, an analog output (AO) signal, and an analog input (AI) signal.

I/O Module

The MC 20 is connected to at least one I/O module 31 through a network 48. The network 48 has a plurality of channels CH0, CH1, CH2, . . . allocated to each I/O module 31. The network 48 may be a network realized using an LSI called general high-speed optimal scalable transceiver (GHOST).

The control of respective devices provided in the substrate processing apparatuses 10 by the MC 20 is performed through the I/O modules 31. For example, the I/O control interface 21 of the MC 20 transmits various control signals to the I/O modules 31. In addition, the I/O control interface 21 also receives status signals of the devices (e.g., the RF power supply 18 and the matching device 17) from the I/O modules 31.

I/O Board

One or more I/O modules 31 corresponding to the MC 20 performs transmission of the input/output signals of control signals to the substrate processing apparatus 10. One I/O module 31 has one or more I/O boards 30. The I/O boards 30 are control boards that directly control respective devices in accordance with instructions from the MC 20.

The functions of the I/O boards 30 are realized using, at least one of, for example, a CPU 32 and a field programmable gate array (FPGA) circuit 34 as a main component. The FPGA circuit 34 is an example of a programmable logic device.

The I/O module 31 is connected to one or more devices. In the present embodiment, the RF power supply 18 and the matcher 17 are connected to one I/O board 30.

For example, controls of output signals (e.g., a DO signal and an AO signal) output to the devices from the MC 20 (the I/O board 30) and input signals (e.g., a DI signal and an AI signal) are executed by the CPU 32 and the FPGA circuit 34.

The DO signal is a digital signal output from the MC 20 located at the high level of the control system to the RF power supply 18 located at the low level of the control system. The DO signal includes a signal for instructing ON of the RF power supply 18. In addition, the DO signal includes a signal for instructing OFF of the RF power supply 18.

The DI signal is a digital signal input from the RF power supply 18 located at the low level of the control system to the MC 20 (the I/O board 30) located at the high level of the control system. The DI signal includes an acknowledgment signal for a command signal for instructing ON of the RF power supply 18. In addition, the DI signal includes an acknowledgment signal for a command signal for instructing ON of the RF power supply 18.

A DO counter 40 built in the FPGA circuit 34 counts the number of rising edges or falling edges of the command signal. The DI counter 41 built in the FPGA circuit 34 counts the number of rising edges or falling edges of the acknowledgment signal for the command signal.

A rise delay time counter 45 built in the FPGA circuit 34 measures a relative time difference between the DO signal which is a command signal for instructing ON of the RF power supply 18 (actually, a DI signal input by feeding back the DO signal) and the DI signal which is an acknowledgment signal for the command signal for instructing ON of the RF power supply 18. A fall delay time counter 46 built in the FPGA circuit 34 measures a relative time difference between the DO signal which is a command signal for instructing OFF of the RF power supply 18 (actually, a DI signal input by feeding back the DO signal) and the DI signal which is an acknowledgment signal for the command signal for instructing OFF of the RF power supply 18.

The AI signal is an analog signal input from the RF power supply 18 and the matcher 17 to the MC 20 (the I/O board 30). The AI signal includes a signal indicating power Pf of a high-frequency (RF) traveling wave supplied from the RF power supply 18 (hereinafter, referred to as a "Pf AI signal"). In addition, the AI signal includes a signal indicating power Pr of a high-frequency (RF) reflected wave supplied from the RF power supply 18 (hereinafter, referred to as a "Pr AI signal").

Further, the AI signal includes a signal indicating voltage Vpp of a high-frequency (RF) traveling wave supplied from the RF power supply 18 (hereinafter, referred to as a "Vpp AI signal"). Further, the AI signal includes a signal indicating a matching position of a variable capacitor provided in the matcher 17 (hereinafter, referred to as a "Load AI signal" or a "Tune AI signal").

A maximum value register 42 built in the CPU 32 stores the maximum value of the Pf AI signal (an analog signal of the power Pf of an RF traveling wave), the maximum value of the Pr AI signal (an analog signal of the power Pr of an RF reflected wave), the maximum value of the Vpp AI signal (an analog signal of the voltage Vpp of the RF traveling wave), and the maximum value of the Load AI signal and the Tune AI signal (a signal indicating the maximum value of a matching position of the matcher 17).

A minimum value register 43 built in the CPU 32 stores the minimum value of the Pf AI signal (an analog signal of the power Pf of an RF traveling wave), the minimum value of the Pr AI signal (an analog signal of the power Pr of an RF reflected wave), the minimum value of the Vpp AI signal (an analog signal of the voltage Vpp of the RF traveling wave), and the minimum value of the Load AI signal and the Tune AI signal (a signal indicating the minimum value of a matching position of the matcher 17).

In addition, an integration register 44 built in the CPU 32 stores the integrated value of the Pf AI signal (an analog signal of the power Pf of the RF traveling wave) and the integrated value of the Pr AI signal (an analog signal of the power RF of the RF reflected wave Pr).

Meanwhile, the various analog signals in the first to sixth embodiments described below refer to signals obtained by digitizing signals having a property represented by an analog value.

Functional Configurations of MC and I/O Board

Figure 3:
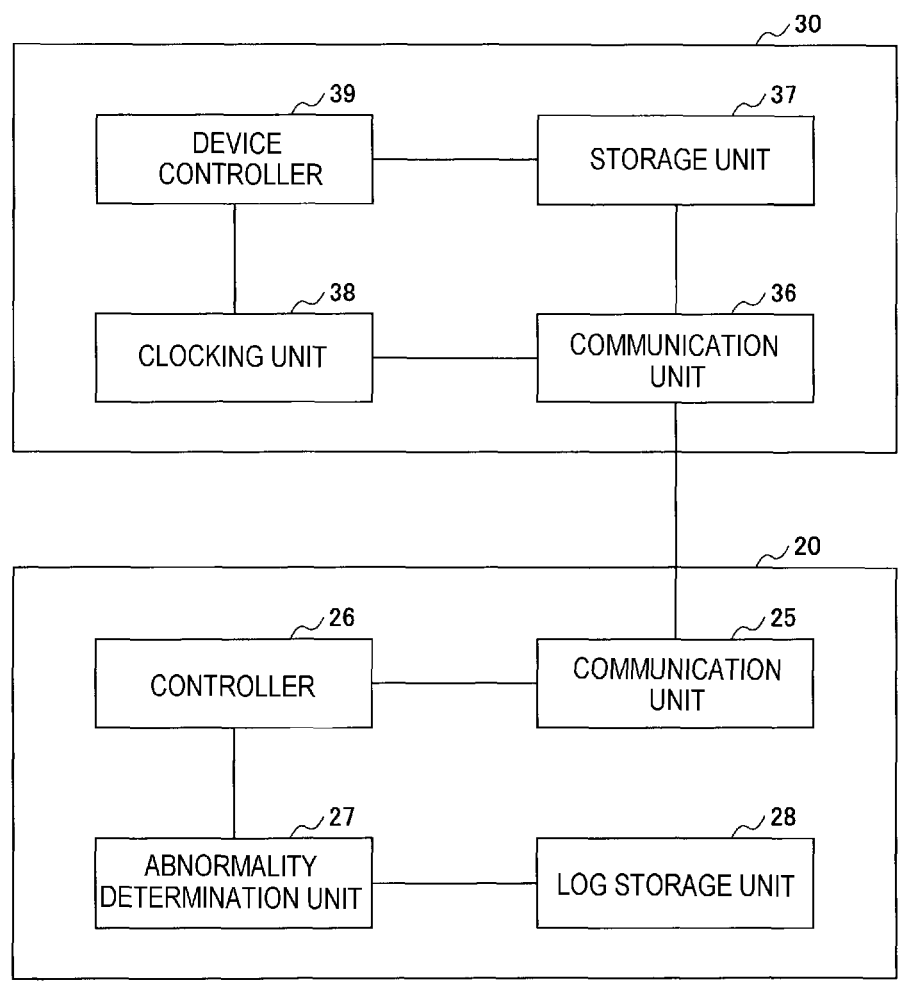
FIG. 3 is a diagram illustrating an example of functional configurations of an MC and an I/O board according to embodiment.

Next, an example of functional configurations of the MC 20 and the I/O board 30 according to an embodiment of the present disclosure will be described with reference to FIG. 3.

Functional Configurations of MC and I/O Board

The I/O board 30 includes a communication unit 36, a storage unit 37, a clocking unit 38, and a device controller 39. The communication unit 36 receives a command signal for turning ON the RF power supply 18 from the MC 20 and transmits a DO signal to the RF power supply 18 in response to the command signal. The communication unit 36 transmits an acknowledgment signal (DI signal) for the command signal (DO signal) to the MC 20. The communication unit 36 transmits an AI signal related to the high frequency of the RF power supply 18 and an AI signal related to the matching position of the matching device 17 to the MC 20.

The device controller 39 collects the status signals of the devices for a predetermined time and at a predetermined sampling interval in a predetermined period and accumulates the collected status signals of the devices in the storage unit 37. More specifically, at least one of: the number of command signals to the RF power supply 18 provided in the substrate processing apparatus 10; the number of acknowledgment signals for the command signals; a signal of power of a high-frequency traveling wave output from the RF power supply 18; a signal of power of a high-frequency reflected wave; a signal of voltage of the high-frequency traveling wave; a signal of a matching position of the matcher 17; a signal indicating an integrated value of the power of the high-frequency traveling wave; a signal indicating a rise delay time of the command signals to the RF power supply 18 and acknowledgment signals for the command signals; and a signal indicating a fall delay time of the command signals to the RF power supply and the acknowledgment signals for the command signals, is collected by the device controller 39 through the communication unit 36 at a predetermined sampling interval and accumulated in the storage unit 37.

For example, the storage unit 37 stores, in the DO counter 40 and the DI counter 41, the number of DO signals for instructing ON of the RF power supply 18 and the number of DI signals which are acknowledgment signals for the DO signals. The storage unit 37 stores the maximum value of various AI signals in the maximum value register 42 and stores the minimum value of the various AI signals in the minimum value register 43. The storage unit 37 stores, in the integration register 44, the cumulative value of AI signals of RF traveling waves and RF reflected waves. The storage unit 37 stores, in the rise delay time counter 45, a difference between a rise of a DO signal for instructing ON of the RF power supply 18 and a rise of a DI signal as a delay time. The storage unit 37 stores, in the fall delay time counter 46, a difference between a fall of a DO signal for instructing ON of the RF power supply 18 and a fall of a DI signal as a delay time.

The clocking unit 38 clocks a predetermined period when collecting the status signals of devices, a predetermined time for sampling in the period, and a sampling interval. As illustrated in FIG. 1, the I/O board 30 polls the RF power supply 18 and the matcher 17 at a predetermined sampling interval in the range of 300 µs to 1 ms, and collects the status signals of the RF power supply 18 and the matcher 17. When the substrate processing apparatus 10 is a plasma ALD apparatus, one process is performed in a cycle of 200 ms to 800 ms. Therefore, the clocking unit 38 clocks a predetermined sampling time every 200 ms to 800 ms (i.e., every one process). For example, in FIG. 8, the predetermined sampling time is 50 ms to 100 ms. That is, as illustrated in the example of an RF AI signal in FIG. 8, for each process intermittently performed in a cycle of 200 ms to 800 ms, polling is performed from the I/O board 30 to the RF power supply 18 and the matcher 17 for a predetermined sampling time (50 ms to 100 ms) during the process and at a predetermined sampling interval in the range of 300 µs to 1 ms. Thus, the I/O board 30 collects the status signals of the RF power supply 18 and the matcher 17 as sampling data. The sampling data of the collected status signals of the devices are stored in the storage unit 37. The storage unit 37 is implemented by the RAM 33 in the CPU 32 and various counters 40 and 41 and the various registers 42 to 44 in the FPGA circuit 34 illustrated in FIG. 2. Meanwhile, in each of the following embodiments, the sampling interval is set to 300 µs, but the sampling interval may be appropriately set without being limited thereto.

The sampling data is transmitted from the I/O board 30 to the MC 20 at the timing of polling performed by the MC 20 every 100 ms.

The device controller 39 controls devices provided in the substrate processing apparatus 10. Specifically, the device controller 39 performs, for example, an ON/OFF control of the RF power supply 18, an exhaust control of the exhaust device 16, and a gas supply control of the gas supply source 14. In addition, depending on an abnormality determination result of a device such as the RF power supply 18 or the matcher 17, the device controller 39 also performs a control of, for example, stopping of the device.

Functional Configuration of MC

The MC 20 includes a communication unit 25, a controller 26, an abnormality determination unit 27, and a log storage unit 28. The communication unit 25 transmits/receives various signals (e.g., a DO signal, a DI signal, and an AI signal) to/from the I/O board 30. The controller 26 controls the substrate processing apparatus 10 in accordance with an instruction from the EC 1.

The abnormality determination unit 27 determines the presence or absence of an abnormality in a device such as the RF power supply 18 or the matcher 17 based on a peak value, an average value, and a median value of sampling data of the status signals of the RF power supply 18 (e.g., PF AI signals) and the status signals of the matcher 17 (e.g., Load/Tune AI signals) of the RF power supply, 18 which are collected in the I/O board 30. More specifically, based on the status signals of the devices and based on at least one of the following signals, the abnormality determination unit 27 may determine the presence or absence of an abnormality in the devices or the presence or absence of an abnormality in the wiring between the devices.

The number of command signals to the RF power supply 18, and the number of acknowledgment signals for the command signals A peak value, a median value, and an average value of signals indicating the power of high-frequency (RF) traveling waves and reflected waves A peak value, a median value, and an average value of signals indicating the voltage of RF traveling waves and reflected waves An integrated value obtained by integrating signals indicating the power of RF traveling waves and reflected waves A peak value, a median value, and an average value of the signals indicating the matching position of the matcher 17

The delay time of the command signals to the RF power supply 18, and the delay time of the acknowledgment signals for the command signals When the abnormality determination unit 27 determines that there is an abnormality in the devices such as the RF power supply 18, the log storage unit 28 stores the status signals of the device determined to be abnormal as log information.

Film Formation Processing Through ALD Method

In a film formation processing through an ALD method, it is necessary to intermittently and repeatedly perform supply of a plurality of gases including a raw material gas and stopping of the supply in a short time. For example, it is sufficient if the period of the plasma control (time of one process) of the CVD apparatus, which performs the film formation processing through the CVD method, is about 100 ms. On the other hand, the period of the plasma control of the ALD apparatus for performing the film formation processing through the ALD method needs to be set to be shortened to about 10 ms because the ON/OFF period of the RF power supply 18 becomes short. Therefore, in the polling performed every 100 ms by the MC 20, the MC 20 may not correctly acquire the status signals of devices such as the RF power supply 18 that is plasma-controlled in a short cycle of about 10 ms.

Thus, in the present embodiment, the status signals of devices are stored in the storage unit 37 in the I/O board 30 by polling performed every 300 μs to 1 ms by the I/O board 30. The MC 20 is able to correctly acquire status signals of the devices such as the RF power supply 18 through the I/O board by acquiring the status signals of devices accumulated in the storage unit 37 in the I/O board 30 in the polling performed every 100 ms. Thus, even in the ALD apparatus in which the plasma is controlled in a short cycle of about 10 ms, based on the acquired status signals of devices, the MC 20 is able to accurately determine the status of devices such as the RF power supply 18 (the presence or absence of an abnormality).

Hereinafter, in the order of first to sixth embodiments, a status signal detecting circuit according to each embodiment and an abnormality detection process using the circuit will be described.

First Embodiment

Figure 4:
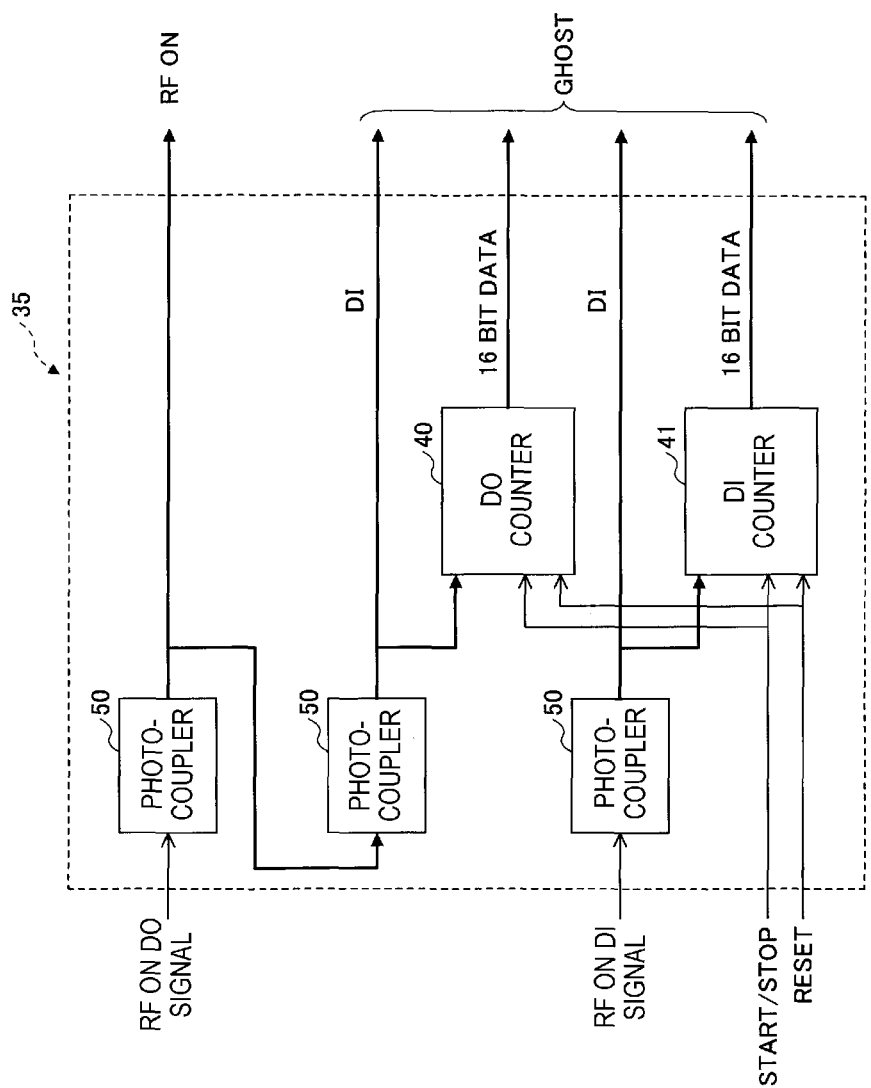
FIG. 4 is a diagram illustrating an example of a status signal detection circuit according to a first embodiment.
Figure 5:
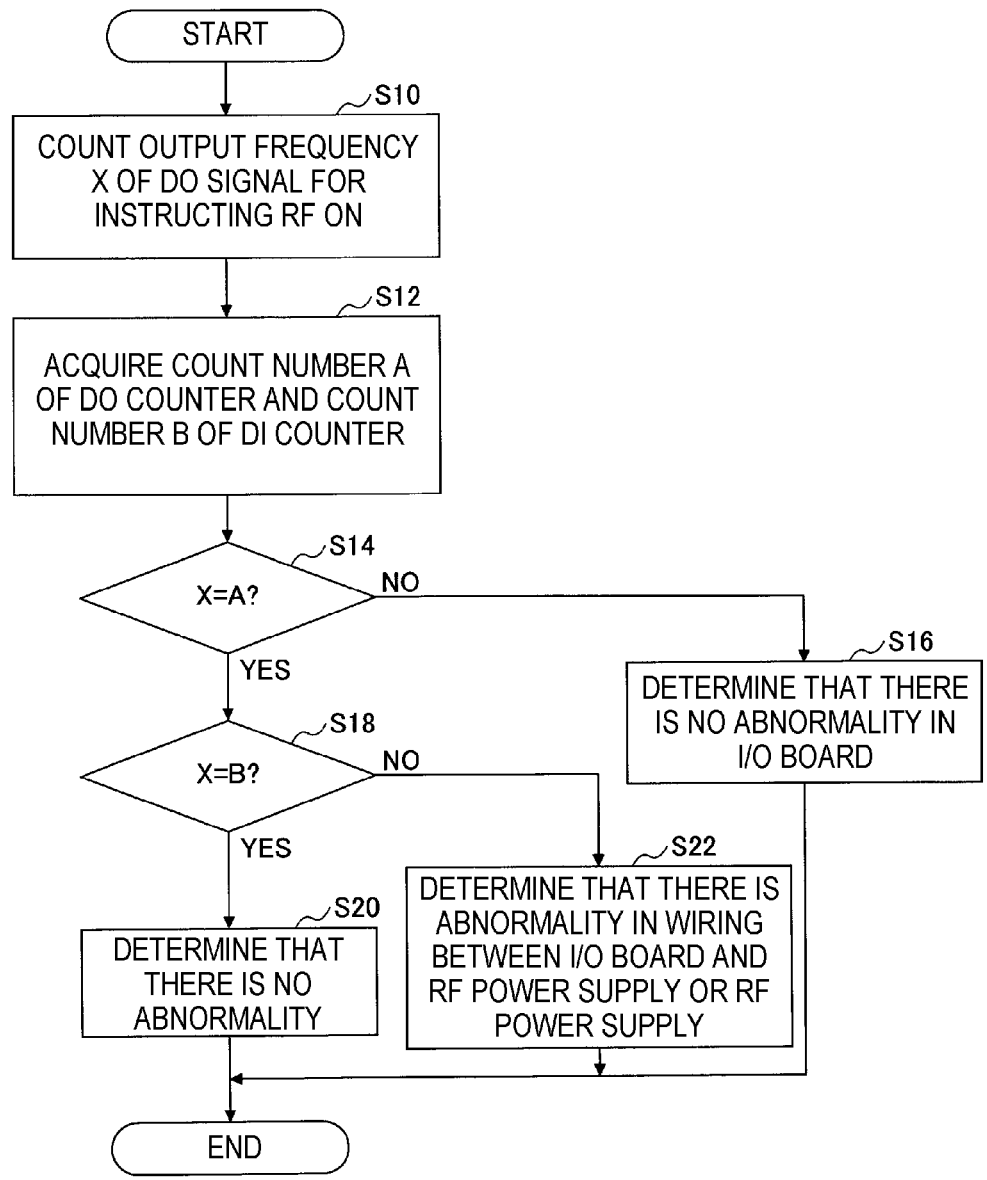
FIG. 5 is a flowchart illustrating an example of an abnormality detection process according to the first embodiment.
Figure 6:
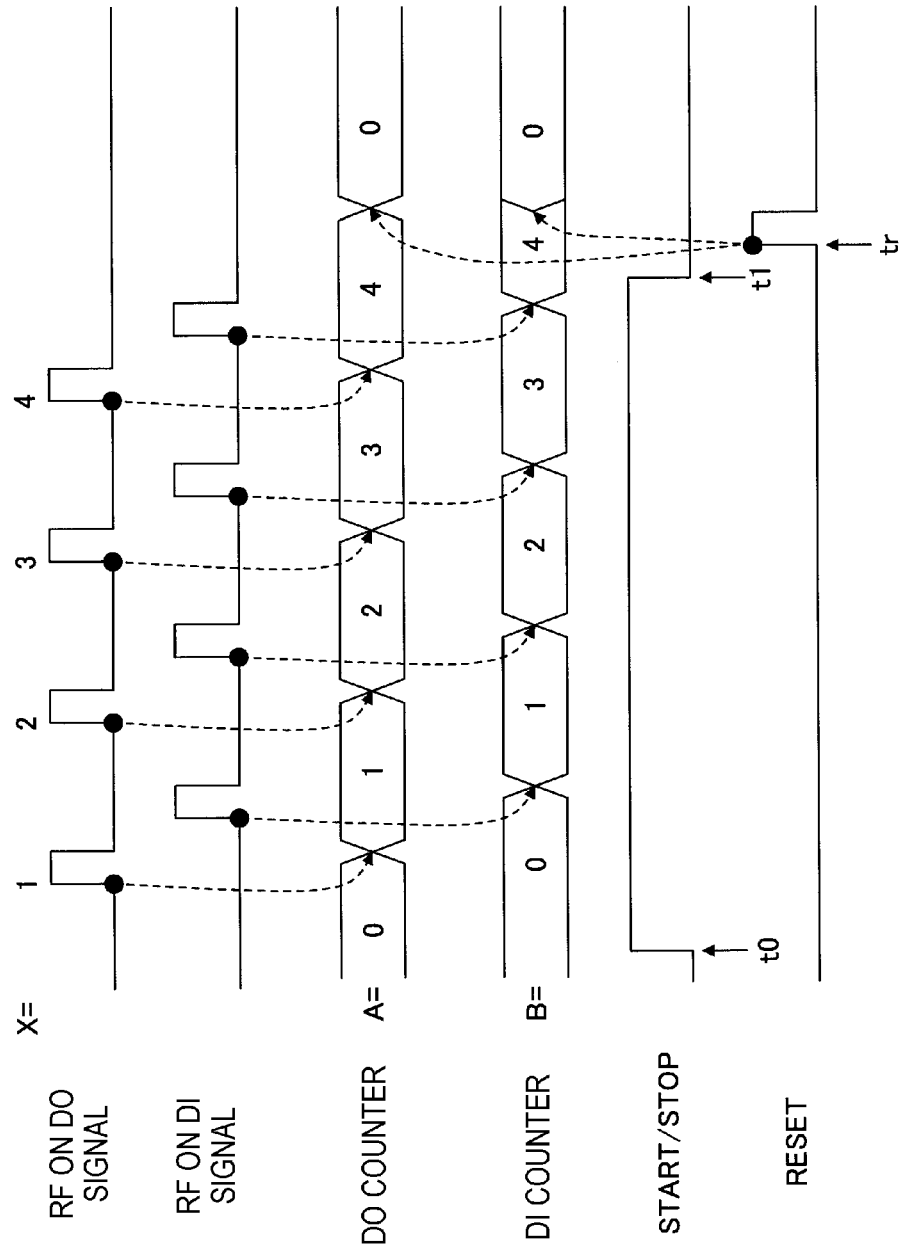
FIG. 6 is a time chart of respective signals in the abnormality detection process according to the first embodiment.

First, examples of an abnormality detection process according to the first embodiment and a status signal detection circuit according to the first embodiment will be described with reference to FIGS. 4 to 6. FIG. 4 illustrates an example of a status signal detection circuit according to the first embodiment. FIG. 5 is a flowchart illustrating an example of an abnormality detection process according to the first embodiment. FIG. 6 is a time chart of respective signals in the abnormality detection process according to the first embodiment.

Status Signal Detection Circuit

A status signal detection circuit 35 according to the first embodiment illustrated in FIG. 4 is provided in the FPGA circuit 34 and includes a photocoupler 50, a DO counter 40, and a DI counter 41. The photocoupler 50 is an element that internally converts an electric signal into light and returns the light to the electric signal, thereby transmitting the signal while electrically insulating the signal.

The DO counter 40 counts the number of signals (DO signals) obtained by feeding back command signals for controlling ON of the RF power supply 18 from the MC 20 through the photocoupler 50. The DI counter 41 counts the number of acknowledgment signals (DI signals) for the DO signals for controlling ON of the RF power supply 18 from the MC 20.

Each of the DO counter 40 and the DI counter 41 is set to 16 bits. As illustrated in FIGS. 6, each of the DO counter 40 and the DI counter 41 starts count in accordance with a START command controlled by MC software (program) installed in the MC 20, and stops the count in accordance with a STOP command. In the present embodiment, the DO counter 40 and the DI counter 41 count the rise edges of the DO signal and the DI signal. However, without being limited thereto, the DO counter 40 and the DI counter 41 may count the fall edges of the DO signal and the DI signal. The DO counter 40 and the DI counter 41 are initialized by a RESET command.

Reading of the counter values of the DO counter 40 and the DI counter 41 is possible even during counting. Meanwhile, for the DI signal, a noise elimination circuit for a signal is provided before the DI counter 41 such that the DI signal, which does not continue the signal level for a predetermined time or longer, is not determined to be a valid signal.

Abnormality Detection Process

The abnormality detection process according to the first embodiment illustrated in FIG. 5 is executed by the MC 20. As a premise, as illustrated in FIG. 6, in accordance with a START command at time t0, the DO counter 40 counts the number of RF ON DO signals A, and the DI counter 41 counts the number of RF ON DI signals B. In addition, in accordance with a STOP command at time t1, the DO counter 40 stops counting the number of the RF ON DO signals A, and the DI counter 41 stops counting the number of the RF ON DI signals B. The DO counter 40 and DI counter 41 are initialized in accordance with a RESET signal at time tr.

When the abnormality detection process illustrated in FIG. 5 is started, the controller 26 counts an output frequency X of a DO signal X for instructing ON of the RF power supply 18 (step S10). The communication unit 25 acquires the count number A stored in the DO counter 40 and the count number B stored in the DI counter 41 from the communication unit 36 of the I/O board 30 (step S12).

Next, the abnormality determination unit 27 determines whether the output frequency X is equal to the count number A (step S14). When it is determined that the output frequency X is not equal to the count number A, the abnormality determination unit 27 determines that there is an abnormality in the I/O board 30 (step S16) and terminates the present process. Meanwhile, when it is determined that the output frequency X is equal to the count number A, the abnormality determination unit 27 determines whether the output frequency X is equal to the count number B (step S18).

When it is determined that the output frequency X is equal to the count number B, the abnormality determination unit 27 determines that there is no abnormality (step S20), and terminates the present process. Meanwhile, when it is determined that the output frequency X is not equal to the count number B, the abnormality determination unit 27 determines that there is an abnormality in the wiring between the I/O board 30 and the RF power supply 18 or the RF power supply 18 (step S22), and terminates the present process.

As described above, according to the abnormality detection system of the first embodiment, it is possible to detect an abnormality in the RF power supply 18, the I/O board 30, and the wiring between the RF power supply 18 and the I/O board 30 provided in the substrate processing apparatus 10.

Second Embodiment

Figure 7:
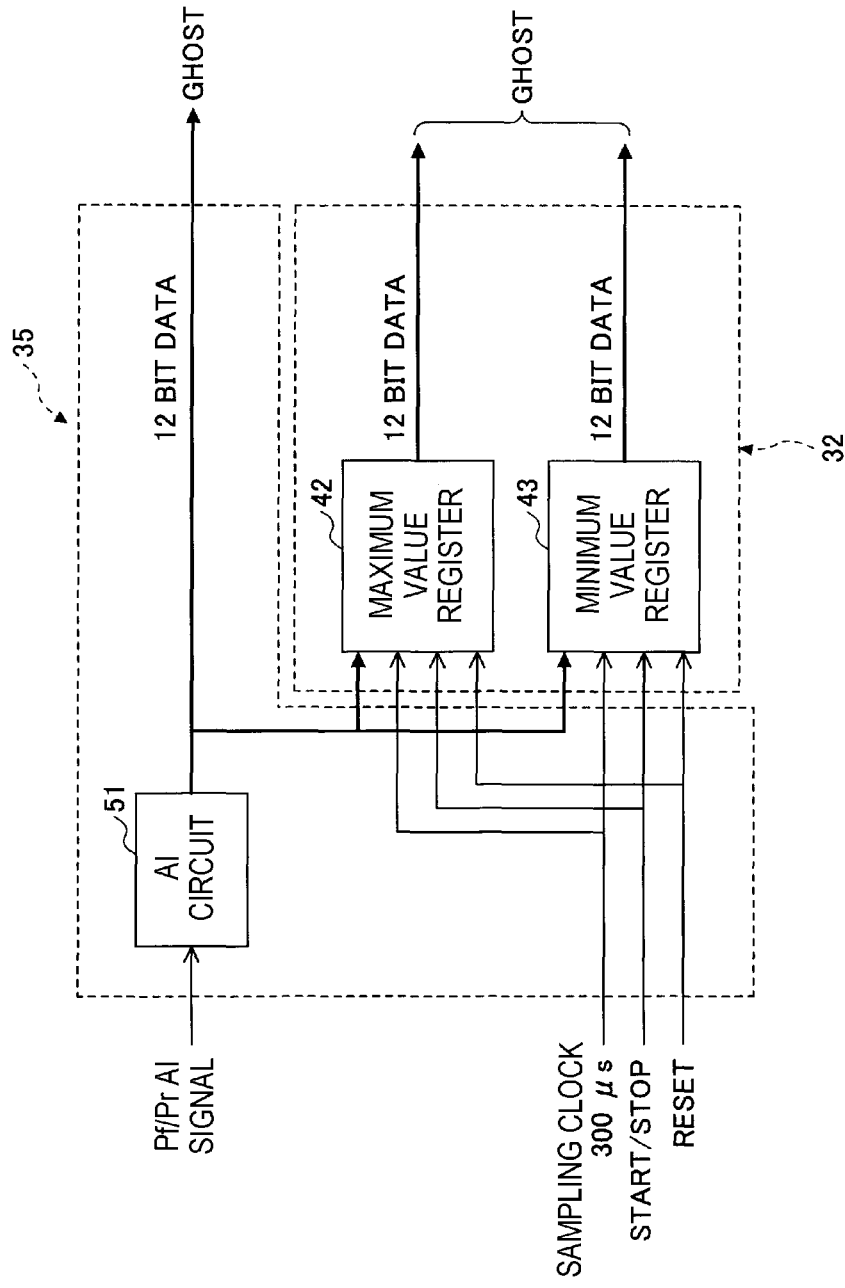
FIG. 7 is a diagram illustrating an example of a status signal detection circuit according to a second embodiment.
Figure 8:
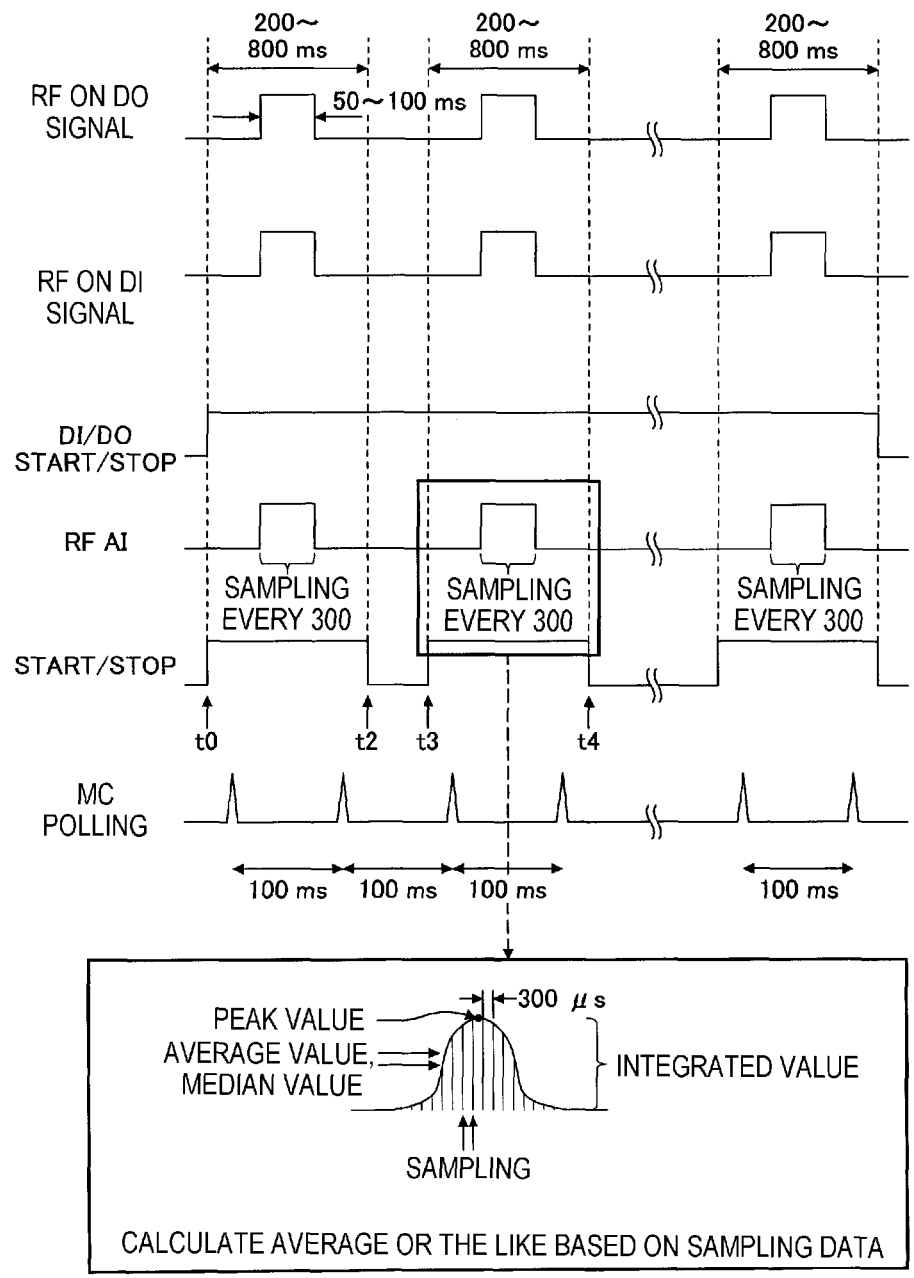
FIG. 8 is a diagram for explaining the timing of status signals (digital and analog signals) according to first to sixth embodiments.
Figure 9:
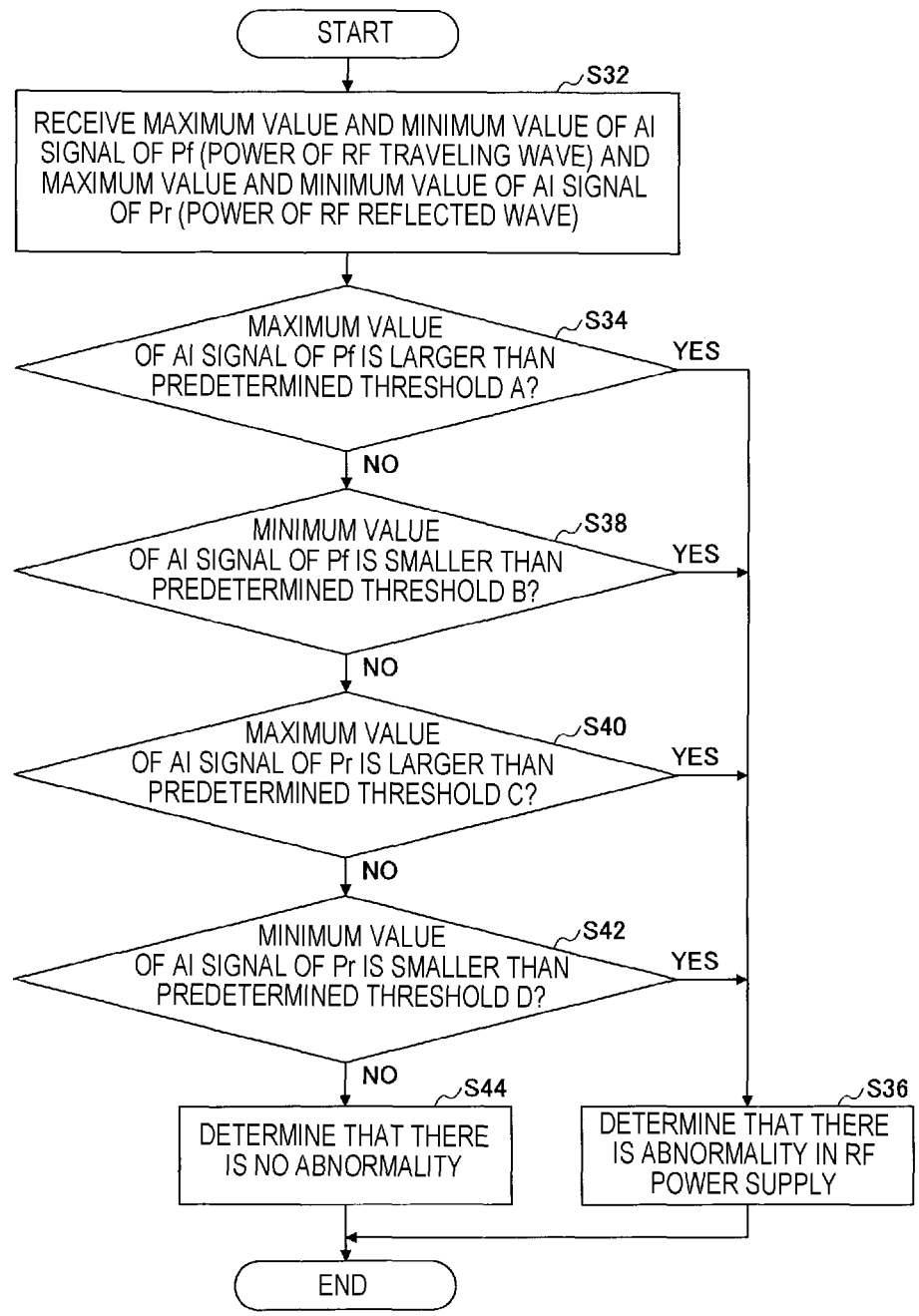
FIG. 9 is a flowchart illustrating an example of an abnormality detection process according to the second embodiment.
Figure 10:
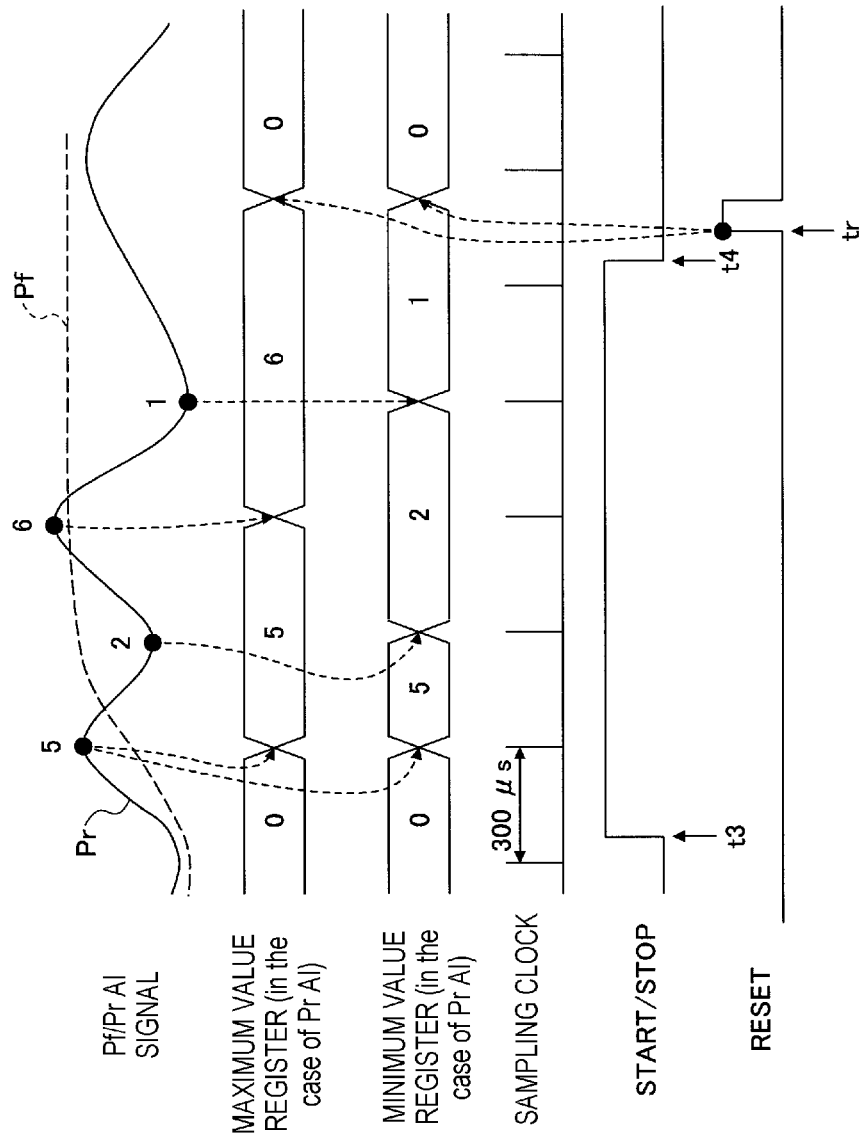
FIG. 10 is a time chart of respective signals in the abnormality detection process according to the second embodiment.

Next, examples of an abnormality detection process according to the second embodiment and a status signal detection circuit according to the second embodiment will be described with reference to FIGS. 7 to 10. FIG. 7 illustrates an example of a status signal detection circuit according to the second embodiment. FIG. 8 is a time chart for explaining status signals (DO, DI, and AI signals) according to the first to sixth embodiments. FIG. 9 is a flowchart illustrating an example of an abnormality detection process according to the second to fifth embodiments. FIG. 10 is a time chart for explaining an example of the abnormality detection process according to the second embodiment.

Status Signal Detection Circuit

A status signal detection circuit 35 according to the second embodiment illustrated in FIG. 7 is provided in the FPGA circuit 34 and includes an AI circuit 51, a maximum value register 42, and a minimum value register 43. The AI circuit 51 outputs a Pf AI signal obtained by digitizing the analog signal of the power Pf of an RF traveling wave into 12-bit data. In addition, the AI circuit 51 outputs a Pr AI signal obtained by digitizing the analog signal of the power Pr of an RF reflected wave into 12-bit data.

As illustrated in FIG. 10, a START command signal is output at time t3, a STOP command signal is output at time t4, and a RESET signal is output at time tr. Data is sampled for every sampling clock of 300 μs, for example, between the START command at time t3 and the STOP command at time t4. Actually, as illustrated in FIG. 8, the interval from the STOP command to the STOP command represents one process, and the sampling time is a predetermined time in the range of 50 ms to 100 ms within one process. Among the sampling data collected according to a sampling clock illustrated in FIG. 10, each of the maximum value of the Pf AI signal and the maximum value of the Pr AI signal is stored in the maximum value register 42. In addition, each of the minimum value of the Pf AI signal and the minimum value of the Pr AI signal is stored in the minimum value register 43.

Each of the maximum value register 42 and the minimum value register 43 is set to 12 bits. Each of the maximum value register 42 and the minimum value register 43 starts the detection of the maximum value and the minimum value by a START command controlled by the MC software of the MC 20, and stops the detection by a STOP command. Further, the maximum value register 42 and the minimum value register 43 are initialized by a RESET command.

Meanwhile, reading of the register values of the maximum value register 42 and the minimum value register 43 is possible even during detection. In addition, the number of detectable AI signals may increase or decrease through the design of the FPGA circuit 34.

When the substrate processing apparatus 10 is a plasma ALD apparatus, one process is performed in 200 ms to 800 ms. Therefore, as illustrated in FIG. 8, each of the interval between the START commands (t0, t3) of the Pf AI signal and the interval between the STOP commands (t2, t4, . . . ) is 200 ms to 800 ms. Therefore, sampling data is collected once for every process of 200 ms to 800 ms.

The sampling data is collected at a sampling interval of 300 μs to 1 ms within a predetermined time in the range of 50 ms to 100 ms. For example, sampling data of a plurality of Pf AI signals and Pr AI signals is collected every 300 μs within a predetermined time of 50 ms. The collected sampling data of the Pf AI signal and Pr AI signal is stored in the storage unit 37 of the I/O board 30.

As described above, the time from the START command (t0) to the STOP command (t1) in the first embodiment includes about 300 processes, and thus the time is longer than the time from the START commands (t0, t3, . . . ) to the STOP commands (t2, t4, . . . ) in the second embodiment.

The MC 20 performs polling every 100 ms, for example. The cycle in which the MC 20 acquires the sampling data of the AI signal is longer than or equal to the predetermined time of 50 ms to 100 ms in one cycle of 200 to 800 ms of the processing through, for example, the ALD method. Therefore, the sampling data of the AI signal acquired by the MC 20 by one polling of the MC 20 is the sampling data of the AI signal for one time, and the sampling data of AI signals for multiple times is not acquired by one polling.

Abnormality Detection Process

The abnormality detection process according to the second embodiment illustrated in FIG. 9 is executed by the MC 20. When the present process is started, in synchronization with the timing of polling, the controller 26 receives, from the I/O board 30, the maximum value and the minimum value of the AI signal of Pf (the power of an RF traveling wave) and the maximum value and the minimum value of the AI signal of Pr (the power of an RF reflected wave) of sampling data collected at a predetermined sampling interval (300 μs in the present embodiment) via the communication unit 25 (step S32).

Next, the abnormality determination unit 27 determines whether or not the maximum value of the AI signal of Pf is larger than a predetermined threshold A (step S34). When it is determined that the maximum value of the AI signal of Pf is larger than the predetermined threshold A, the abnormality determination unit 27 determines that there is an abnormality in the RF power supply 18 (step S36), and terminates the present process. Meanwhile, when it is determined that the maximum value of the AI signal of Pf is equal to or less than the predetermined threshold A, the abnormality determination unit 27 determines whether or not the minimum value of the AI signal of Pf is smaller than the predetermined threshold B (step S38).

When it is determined that the minimum value of the AI signal of Pf is smaller than the predetermined threshold B, the abnormality determination unit 27 determines that there is an abnormality in the RF power supply 18 (step S36), and terminates the present process. Meanwhile, when it is determined that the minimum value of the AI signal of Pf is equal to or larger than the predetermined threshold B, the abnormality determination unit 27 determines whether or not the maximum value of the AI signal of Pr is larger than a predetermined threshold C (step S40). When it is determined that the maximum value of the AI signal of Pr is larger than the predetermined threshold C, the abnormality determination unit 27 determines that there is an abnormality in the RF power supply 18 (step S36), and terminates the present process. Meanwhile, when it is determined that the maximum value of the AI signal of Pr is equal to or less than the predetermined threshold C, the abnormality determination unit 27 determines whether or not the minimum value of the AI signal of Pr is smaller than a predetermined threshold D (step S42).

When it is determined that the minimum value of the AI signal of Pr is smaller than the predetermined threshold D, the abnormality determination unit 27 determines that there is an abnormality in the RF power supply 18 (step S36), and terminates the present process. When it is determined that the minimum value of the AI signal of Pr is equal to or larger than the predetermined threshold D, the abnormality determination unit 27 determines that there is no abnormality in the devices (step S44), and terminates the present process.

As an example of the predetermined thresholds A to D, the maximum value and the minimum value of the values in the range of ±5% of the center value of the AI signal of Pf when executing a normal process are set to the threshold A and the threshold B, respectively. Similarly, the maximum value and the minimum value of the values in the range of ±5% of the center value of the AI signal of Pr when the normal process is executed may be set to the threshold C and the threshold D, respectively. However, setting of each of the thresholds A to D is not limited to this, and other allowable values indicating a range not deviating from a normal process may be used.

As described above, according to the abnormality detection system of the second embodiment, the I/O board 30 collects the sampling data of the AI signal of Pf and the AI signal of Pr at a sampling interval of, for example, 300 μs which is a time equal to or less than the polling cycle of the MC 20, and stores the sampling data in the storage unit 37. Thus, the collected sampling data is temporarily accumulated in the I/O board 30. By acquiring the sampling data from the I/O board 30 in the polling cycle, the MC 20 is able to accurately detect an abnormality in the RF power supply 18 based on the accumulated sampling data.

In the second embodiment, the MC 20 determines the presence or absence of an abnormality in a device such as the RF power supply 18 based on the maximum value and the minimum value of the Pf AI signal and the maximum value and the minimum value of the Pr AI signal, but is not limited thereto. The MC 20 may calculate, for example, the peak value, the average value, and the median value of the sampling data acquired from the I/O board 30 for each polling, and may determine the presence or absence of an abnormality in the device based on the calculation result.

Third Embodiment

Figure 11:
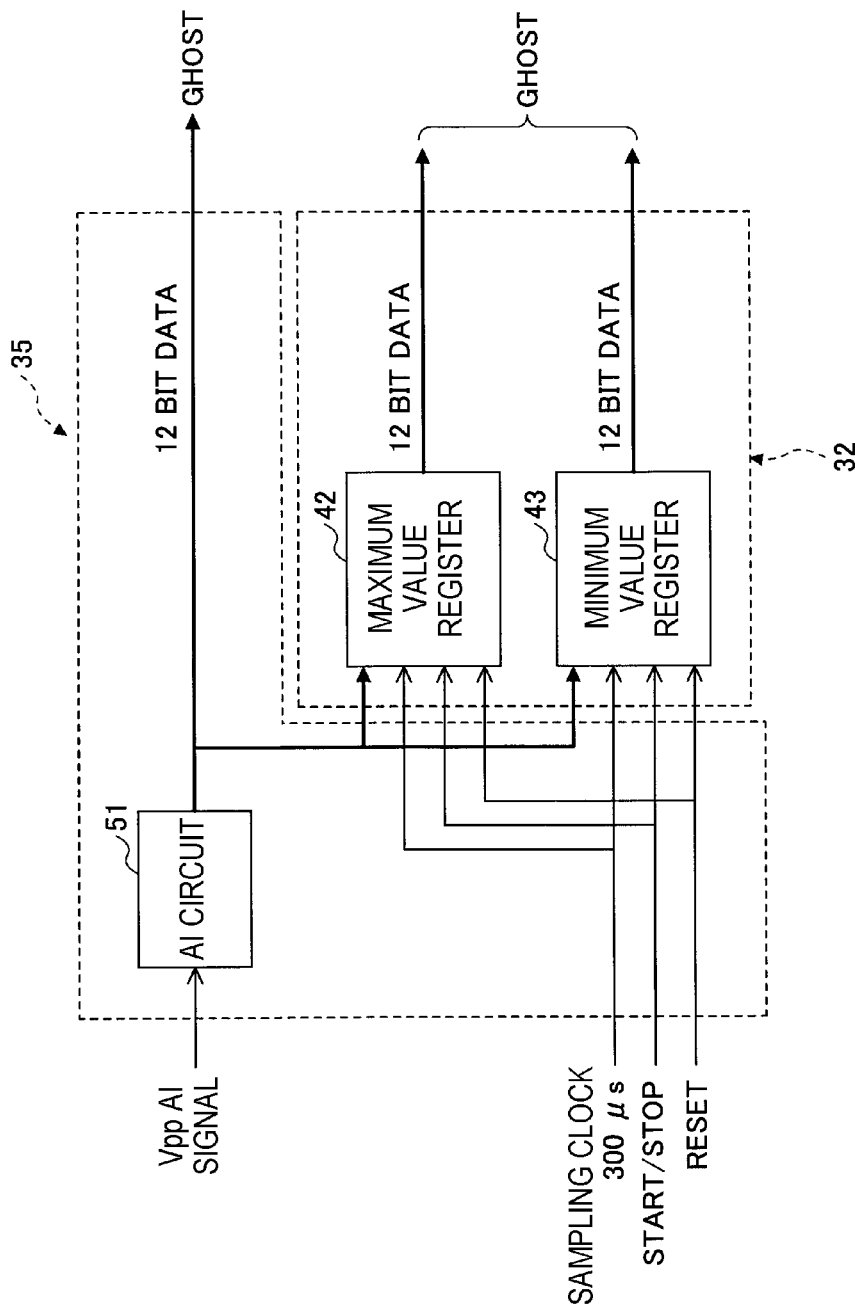
FIG. 11 is a diagram illustrating an example of a status signal detection circuit according to the third embodiment.
Figure 12:
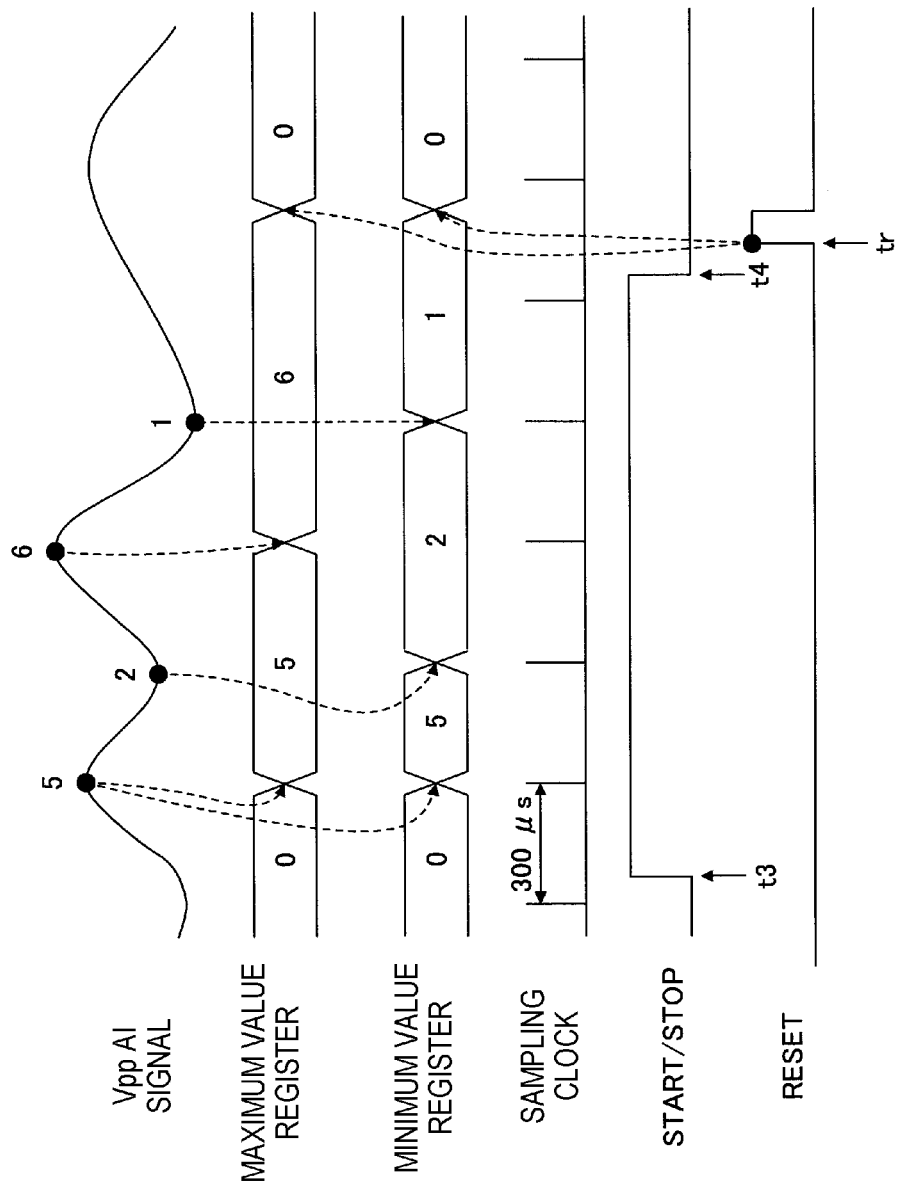
FIG. 12 is a time chart of respective signals in an abnormality detection process according to the third embodiment.

Next, examples of an abnormality detection process according to the third embodiment and a status signal detection circuit according to the third embodiment will be described with reference to FIGS. 11 and 12. FIG. 11 illustrates an example of a status signal detection circuit according to the third embodiment. FIG. 12 is a time chart of respective signals in an abnormality detection process according to the third embodiment.

Status Signal Detection Circuit

A status signal detection circuit 35 according to the third embodiment illustrated in FIG. 11 is provided in the FPGA circuit 34 and includes an AI circuit 51, a maximum value register 42, and a minimum value register 43. The AI circuit 51 outputs a Vpp AI signal obtained by digitizing the analog signal of the voltage Vpp of an RF traveling wave into 12-bit data.

Each of the maximum value register 42 and the minimum value register 43 is set to 12 bits. Each of the maximum value register 42 and the minimum value register 43 starts the detection of the maximum value and the minimum value of the Vpp AI signal according to a START command controlled by the MC software of the MC 20, and stops the detection by a STOP command. Further, the maximum value register 42 and the minimum value register 43 are initialized by a RESET command. Reading of the register values of the maximum value register 42 and the minimum value register 43 is possible even during detection.

As illustrated in FIG. 12, the START command signal is output at time t3, the STOP command signal is output at time t4, and the RESET signal is output at time tr. Data is sampled for every sampling clock of 300 μs, for example, between the START command at time t3 and the STOP command at time t4. Among the sampling data, the maximum value of the Vpp AI signal is stored in the maximum value register 42, and the minimum value of the Vpp AI signal is stored in the minimum value register 43.

As in the case of the second embodiment, sampling data is collected at a sampling interval of 300 μs for a predetermined time in the range of 50 ms to 100 ms for every process of 200 ms to 800 ms. In the present embodiment, data of the Vpp AI signal is collected every 300 μs for a predetermined time of 50 ms. The collected sampling data of the Vpp AI signal is stored in the storage unit 37 of the I/O board 30.

Abnormality Detection Process

As in the second embodiment, the MC 20 determines the presence or absence of an abnormality in a device such as the RF power supply 18 based on the maximum value and the minimum value of the sampling data acquired from the I/O board 30 for each polling. Specifically, while the sampling data used in the abnormality detection process of FIG. 9 is the sampling data of the Pf AI signal and the Pr AI signal, the present embodiment performs the same process as the abnormality detection process in FIG. 9 using the sampling data of the Vpp AI signal. That is, when the maximum value of the Vpp AI signal is larger than a predetermined threshold E or when the minimum value of the Vpp AI signal is smaller than a predetermined threshold F, it is determined that there is an abnormality in the RF power supply. Otherwise, it is determined that there is no abnormality and the process is terminated.

This makes it possible to determine the presence or absence of an abnormality in the RF power supply 18. Meanwhile, the MC 20 may calculate, for example, the peak value, the average value, and the median value of the sampling data acquired from the I/O board 30 for each polling, and may determine the presence or absence of an abnormality in the device based on the calculation result.

As described above, according to the abnormality detection system of the third embodiment, the I/O board 30 collects the sampling data of the Vpp AI signal at a sampling interval of, for example, 300 μs which is a time equal to or less than the polling cycle of the MC 20, and stores the sampling data in the storage unit 37. Thus, the collected sampling data is temporarily accumulated in the I/O board 30. By acquiring the sampling data from the I/O board 30 in the polling cycle, the MC 20 is able to determine the presence or absence of an abnormality in the RF power supply 18 based on the accumulated sampling data.

Fourth Embodiment

Figure 13:
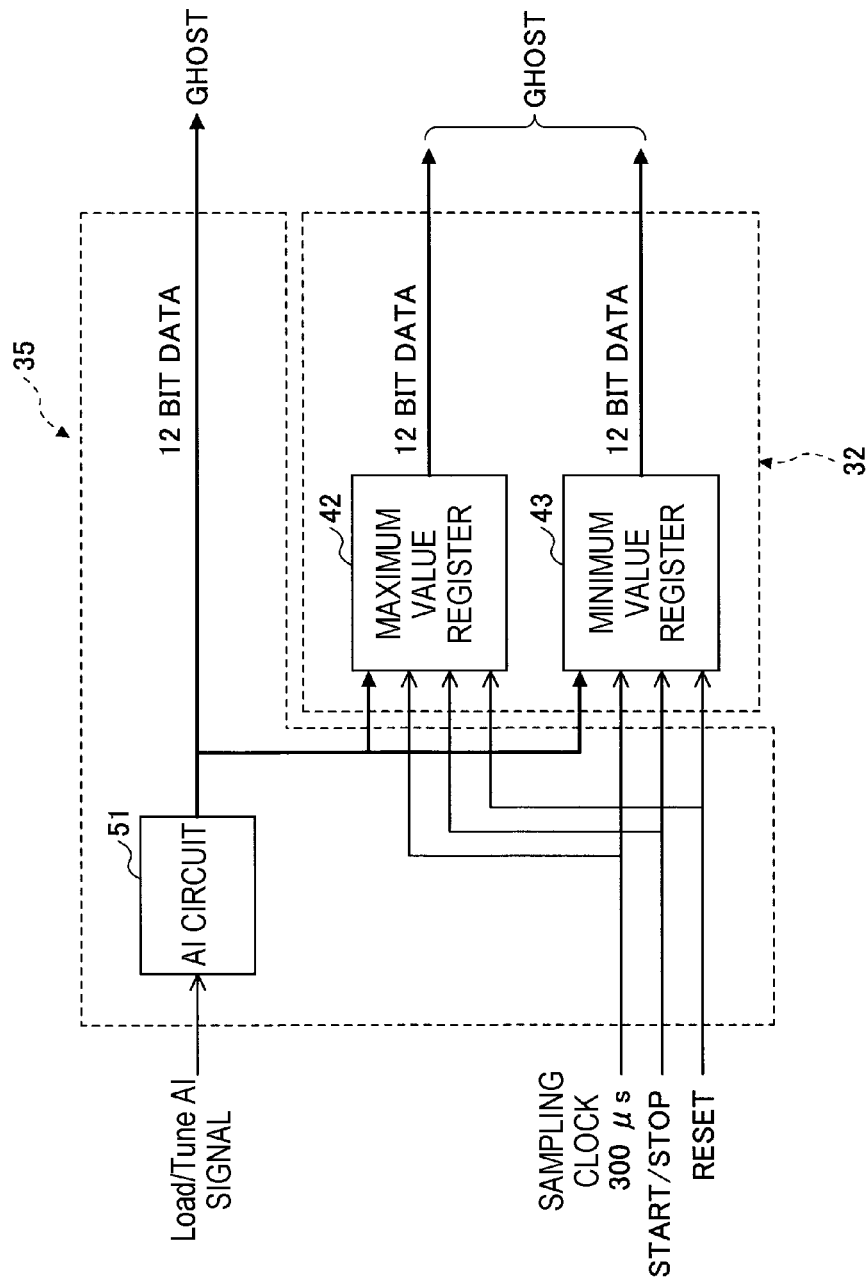
FIG. 13 is a diagram illustrating an example of a status signal detection circuit according to the fourth embodiment.
Figure 14:
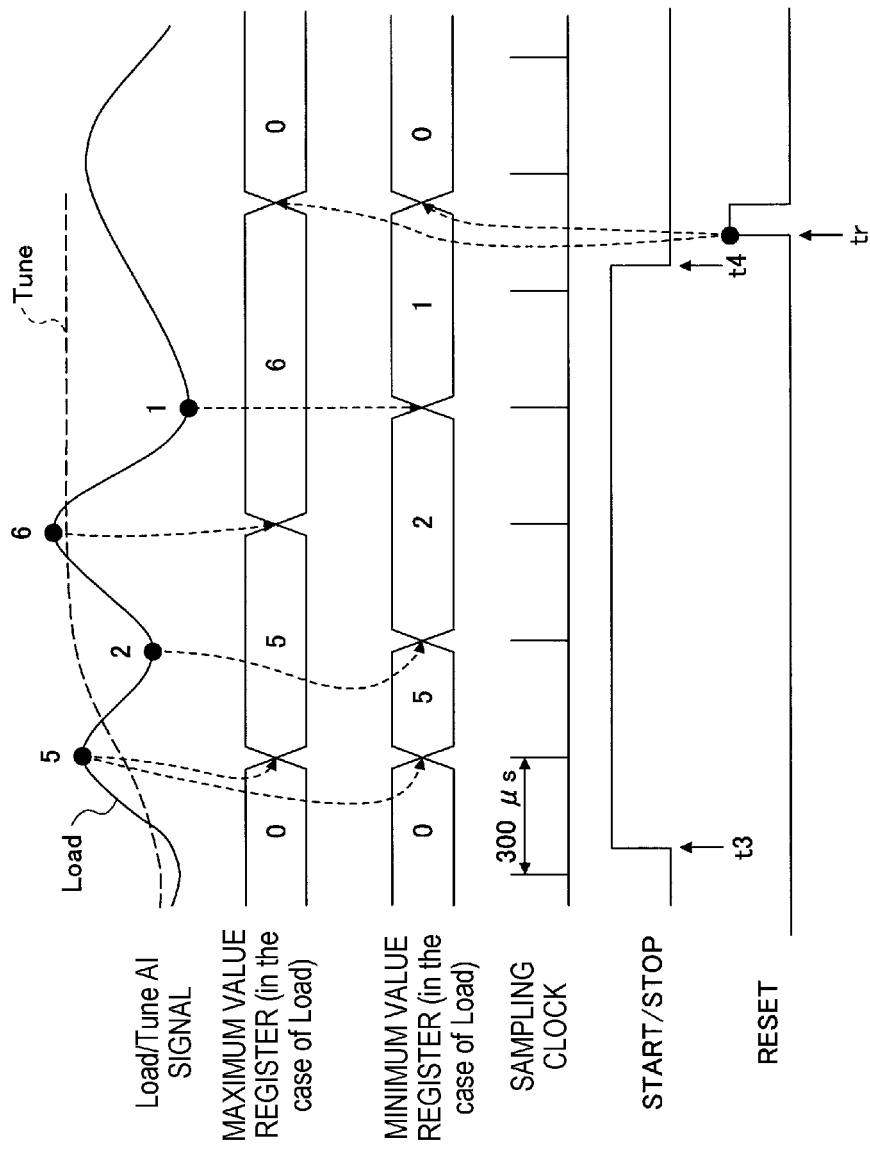
FIG. 14 is a time chart of respective signals in an abnormality detection process according to the fourth embodiment.

Next, examples of an abnormality detection process according to the fourth embodiment and a status signal detection circuit according to the fourth embodiment will be described with reference to FIGS. 13 and 14. FIG. 13 illustrates an example of a status signal detection circuit according to the fourth embodiment. FIG. 14 is a time chart of respective signals in an abnormality detection process according to the fourth embodiment.

Status Signal Detection Circuit

A status signal detection circuit 35 according to the fourth embodiment illustrated in FIG. 13 is provided in the FPGA circuit 34 and includes an AI circuit 51, a maximum value register 42, and a minimum value register 43. The AI circuit 51 outputs a Load AI signal and a Tune AI signal obtained by digitizing analog signals of a load position and a tune position, which are matching positions of the matcher 17, into 12-bit data.

Each of the maximum value register 42 and the minimum value register 43 is set to 12 bits. Each of the maximum value register 42 and the minimum value register 43 starts the detection of the maximum value and the minimum value of the Load AI signal and the Tune AI signal according to a START command controlled by the MC software of the MC 20, and stops the detection by a STOP command. Further, the maximum value register 42 and the minimum value register 43 are initialized by a RESET command. Meanwhile, reading of the register values of the maximum value register 42 and the minimum value register 43 is possible even during detection.

As illustrated in FIG. 14, the START command signal is output at time t3, the STOP command signal is output at time t4, and the RESET signal is output at time tr. Data is sampled for every sampling clock of 300 μs, for example, between the START command at time t3 and the STOP command at time t4. Among the sampling data, the maximum value of the Load AI signal and the Tune AI signal is stored in the maximum value register 42, and the minimum value of the Load AI signal and the Tune AI signal is stored in the minimum value register 43.

As in the case of the second embodiment, sampling data is collected at a sampling interval of 300 μs for a predetermined time in the range of 50 ms to 100 ms for every process of 200 ms to 800 ms. In the present embodiment, sampling data of the Load AI signal and the Tune AI signal is collected every 300 μs for a predetermined time of 50 ms. The collected sampling data of the Load AI signal and the Tune AI signal is stored in the storage unit 37 of the I/O board 30.

Abnormality Detection Process

As in the second embodiment, the MC 20 determines the presence or absence of an abnormality in a device such as the matcher 17 based on the maximum value and the minimum value of the sampling data acquired from the I/O board 30 for each polling. Specifically, while the sampling data used in the abnormality detection process of FIG. 9 is sampling data of the Pf AI signal and the Pr AI signal, the present embodiment performs the same process as the abnormality detection process of FIG. 9 using the sampling data of the Load AI signal and the Tune AI signal of the matcher 17 by replacing the Pf AI signal and the Pr AI signal in FIG. 9 with the Load AI signal and the Tune AI signal. This makes it possible to determine the presence or absence of an abnormality in the matcher 17. Meanwhile, the MC 20 may calculate, for example, the peak value, the average value, and the median value of the sampling data acquired from the I/O board 30 for each polling, and may determine the presence or absence of an abnormality in the device based on the calculation result.

As described above, according to the abnormality detection system of the fourth embodiment, the I/O board 30 collects the sampling data of the Load AI signal and the Tune AI signal in a shorter time than the polling cycle of the MC 20. Thus, the collected sampling data is temporarily accumulated in the I/O board 30. By acquiring the sampling data from the I/O board 30 in the polling cycle, the MC 20 is able to determine the presence or absence of an abnormality in the matcher 17 based on the accumulated sampling data.

Fifth Embodiment

Figure 15:
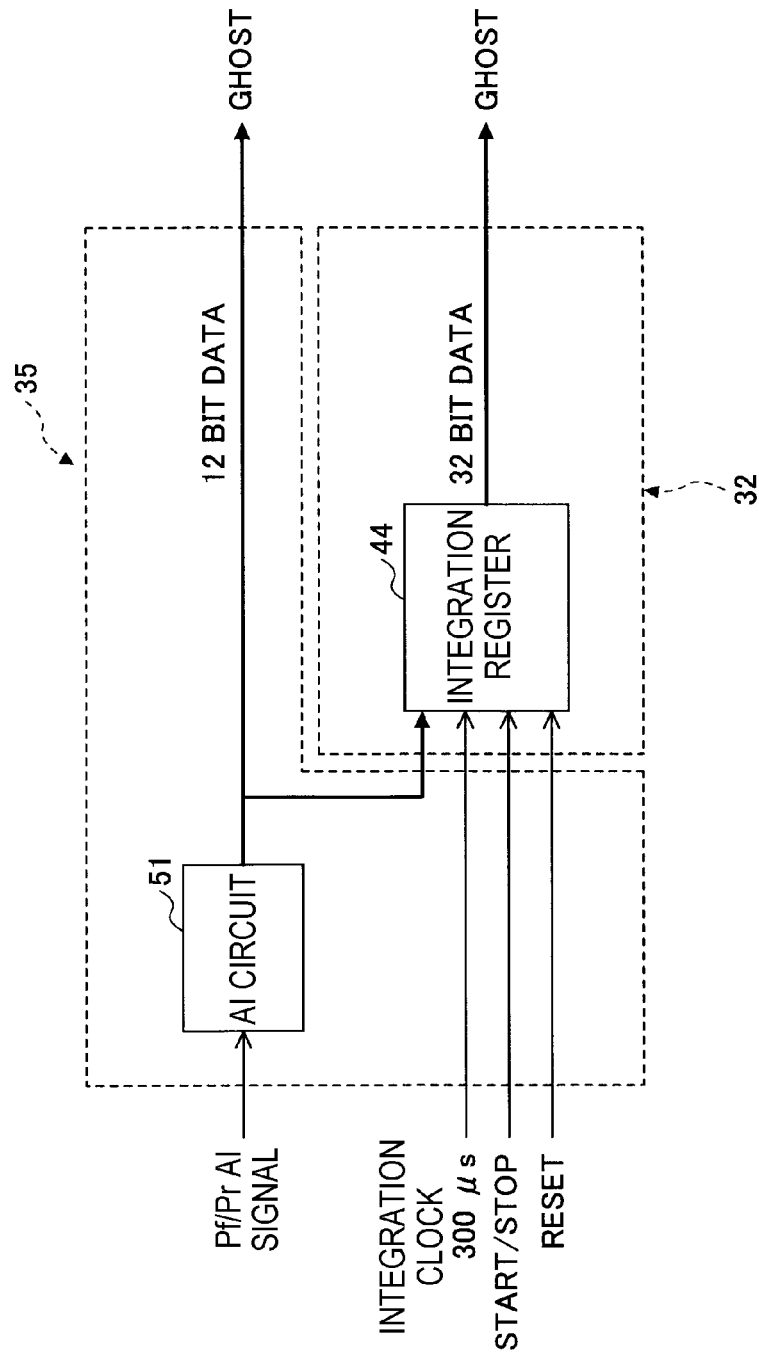
FIG. 15 is a diagram illustrating an example of a status signal detection circuit according to the fifth embodiment.
Figure 16:
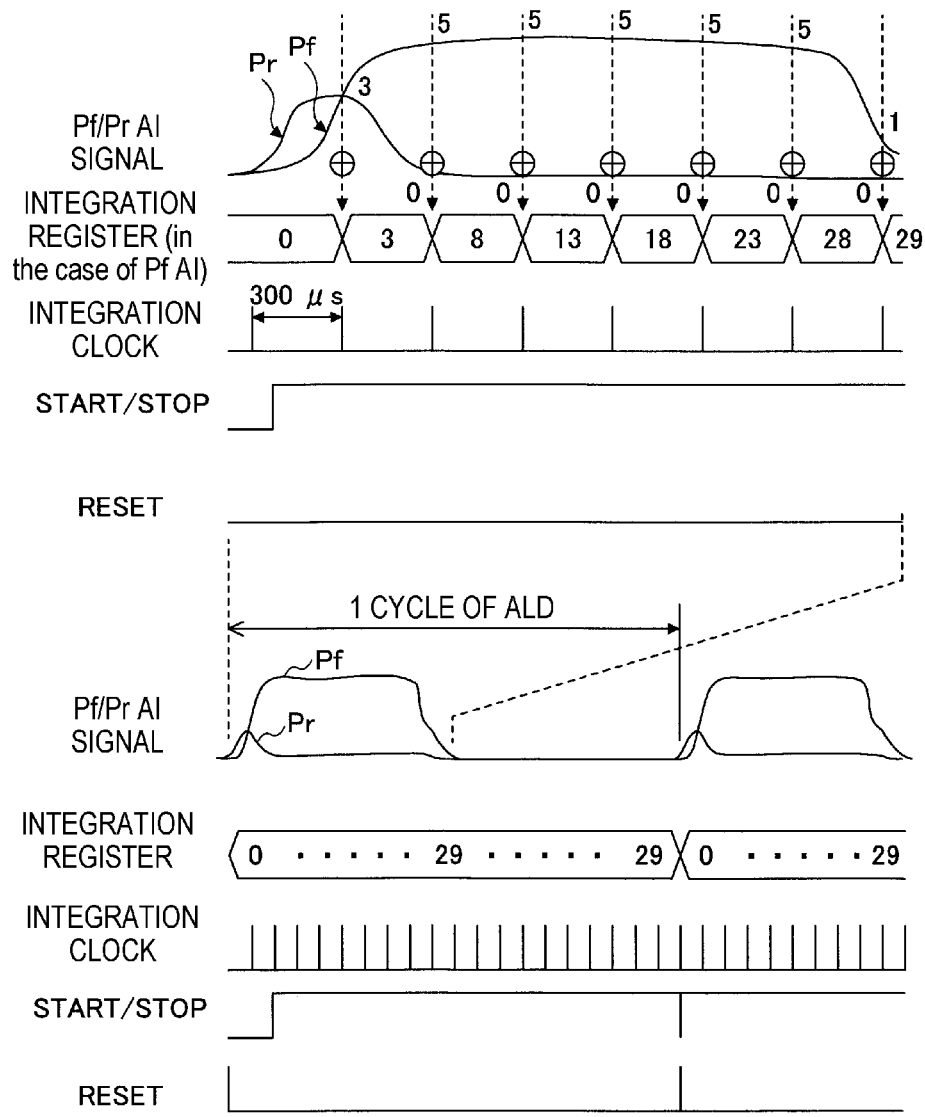
FIG. 16 is a time chart of respective signals in an abnormality detection process according to the fifth embodiment.
Figure 17:
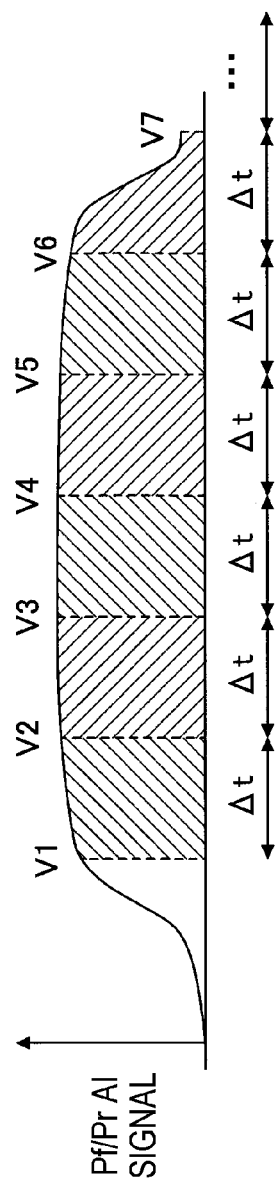
FIG. 17 is a diagram for explaining an integration method in the abnormality detection process according to the fifth embodiment.

Next, examples of an abnormality detection process according to the fifth embodiment and a status signal detection circuit according to the fifth embodiment will be described with reference to FIGS. 15 to 17. FIG. 15 illustrates an example of a status signal detection circuit according to the fifth embodiment. FIG. 16 is a time chart of respective signals in an abnormality detection process according to the fifth embodiment. FIG. 17 is a diagram for explaining an integration method in the abnormality detection process according to the fifth embodiment.

Status Signal Detection Circuit

A status signal detection circuit 35 according to the fifth embodiment illustrated in FIG. 15 is provided in the FPGA circuit 34 and includes an AI circuit 51 and an integration register 44. The AI circuit 51 outputs a Pf AI signal and a Pr AI signal obtained by digitizing the analog signal of the power Pf of an RF traveling wave and the analog signal of the power Pr of an RF reflected wave into 12-bit data.

The integration register 44 is set to 32 bits, starts the integration of the Pf AI signal and the Pr AI signal by a START command under the control of the MC software, and stops the integration by a STOP instruction. In addition, the integration register 44 is initialized by a RESET command.

The integration interval is the same as the set value in the range of 300 μs to 1 ms which is the sampling interval of the AI circuit 51. In the present embodiment, the integration interval is 300 μs. Reading of a register value of the integration register 44 is possible even during integration. However, since the 32-bit data corresponds to a read cycle of 16 bits×2 times, when a carry from the 16th bit to the 17th bit occurs during this, an inaccurate read value is obtained. However, when 12-bit data is added to the 32-bit accumulation register 44 at an interval of 300 μs, integration up to 300 μs×$2^{(32-12)}$=5 minutes is possible. Therefore, the integration register 44 is sufficient to integrate the sampling data of the Pf AI signal and the Pr AI signal sampled for each cycle of film formation by an ALD method, and there is no possibility that a carry will occur to make an integrated value inaccurate.

As illustrated in FIG. 16, when the values of the Pf AI signal according to an integration clock are 3, 5, 5, 5, 5, 5, 1 . . . , the values stored in the integration register 44 are 3, 8, 13, 18, 23, 28, 29 . . . . When the values of the Pr AI signal according to an integration clock are 3, 0, 0, 0, 0, 0, 0, . . . , the values stored in the integration register 44 are 3, 3, 3, 3, 3, . . . . When the integration clock is synchronized with the sampling clock and data is sampled for every sampling clock of 300 µs, for example, the sampling data is integrated for every integration clock of 300 µs. The CPU 32 calculates the integrated values of the sampling data of the Pf AI signal and the Pr AI signal using Equation 1 as follows, and stores the integrated values in the integration register 44.

Abnormality Detection Process

The MC 20 acquires the integrated values of the sampling data of the Pf AI signal and the Pr AI signal acquired from the I/O board 30 for each polling. The MC 20 determines the presence or absence of an abnormality in the RF power supply 18 in one cycle of the ALD on the basis of the integration result. In addition, the MC 20 determines the presence or absence of an abnormality in the RF power supply 18 in one process by summing up the integrated values of each cycle of ALD. Meanwhile, the calculated integrated values of one cycle of the ALD is accumulated in the accumulation register 44, and the MC 20 collects the integrated values accumulated in the accumulation register 44 and calculates the integrated values of one process.

$$\text{Area of } Pf/Pr\ AI = \text{sum of areas of trapezoids in } \Delta t = \qquad (1)$$
$$\frac{1}{2}(V_1 + V_2) \times \Delta t + \frac{1}{2}(V_2 + V_3) \times \Delta t + \ldots \frac{1}{2}(V_{n-1} + V_n) \times \Delta t =$$
$$\left(\frac{1}{2}V_1 + V_2 + V_3 \ldots + V_{n-1} + \frac{1}{2}V_n\right) \times \Delta t$$

$\Delta t$ in Expression 1 is an integration interval (=a sampling interval), which is 300 µs in the present embodiment. $V_n$ represents $n^{th}$ (1≤n) sampling data of the Pf AI signal and the Pr AI signal.

The integrated values represent the total power of the RF traveling wave and the total power of the RF reflected wave. Accordingly, when the integrated values deviate from a predetermined range of a predetermined threshold, the abnormality determination unit 27 determines that the RF power supply 18 is abnormal.

As described above, according to the abnormality detection system of the fifth embodiment, the integrated values based on the sampling data of the collected Pf AI signals and the collected data of the Pr AI signals are temporarily stored in the I/O board 30, and the MC 20 acquires the integrated values from the I/O board 30 according to the polling. As a result, it is possible to accurately detect the abnormality in the RF power supply 18 based on the integrated values of the output of the RF power supply 18.

Sixth Embodiment

Figure 18:
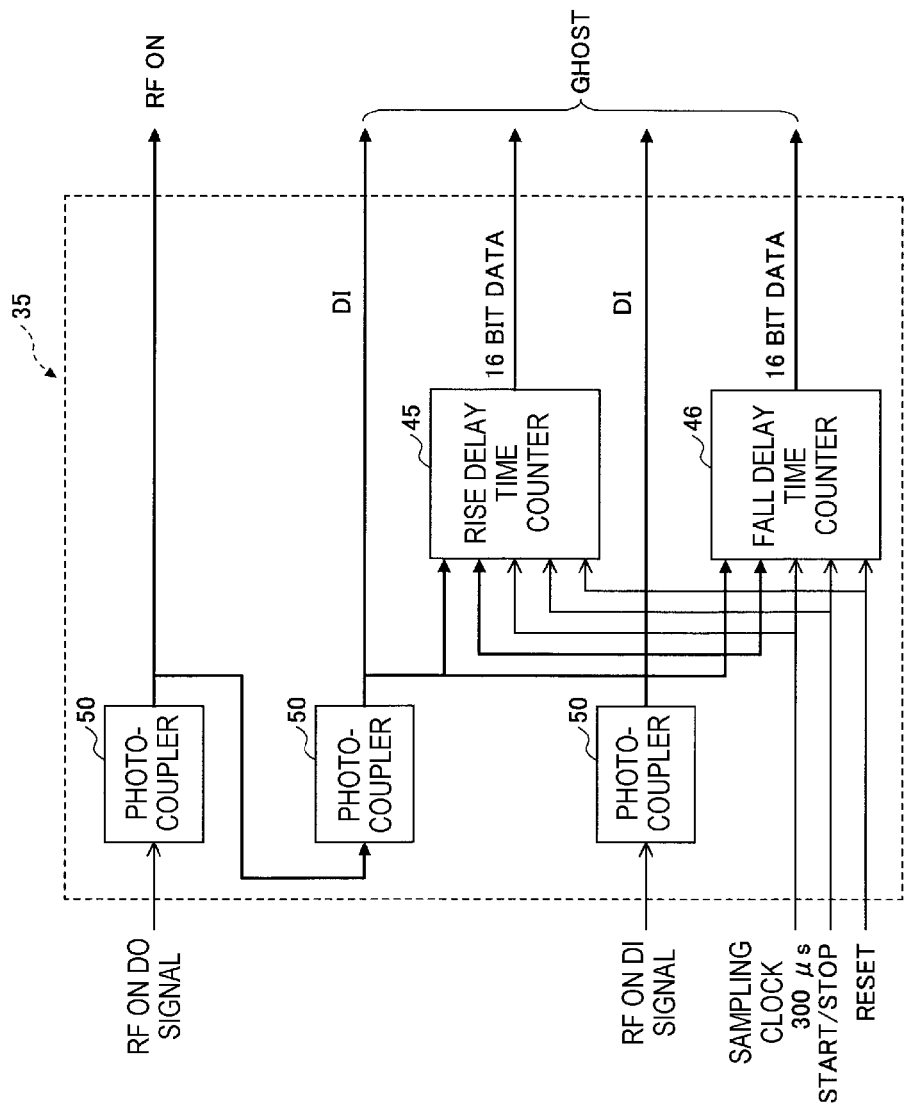
FIG. 18 is a diagram illustrating an example of a status signal detection circuit according to the sixth embodiment.
Figure 19:
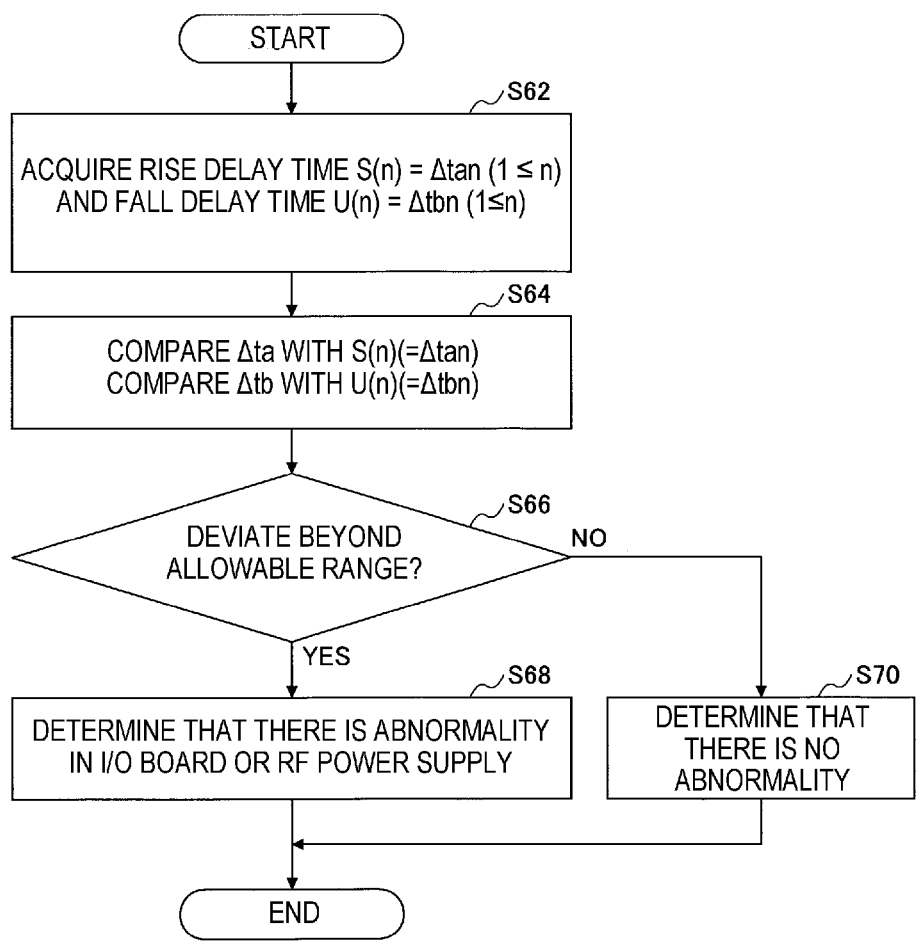
FIG. 19 is a flowchart illustrating an example of an abnormality detection process according to the sixth embodiment.

Next, examples of an abnormality detection process according to the sixth embodiment and a status signal detection circuit according to the sixth embodiment will be described with reference to FIGS. 18 to 20. FIG. 18 illustrates an example of a status signal detection circuit according to the sixth embodiment. FIG. 19 is a flowchart illustrating an example of an abnormality detection process according to the sixth embodiment. FIG. 20 is a time chart of respective signals in the abnormality detection process according to the sixth embodiment.

Status Signal Detection Circuit

A status signal detection circuit 35 according to the sixth embodiment illustrated in FIG. 18 is provided in the FPGA circuit 34 and includes a photocoupler 50, a rise delay time counter 45, and a fall delay time counter 46.

The rise delay time counter 45 and the fall delay time counter 46 measure a relative time difference between a DO signal for instructing ON of the RF power supply 18 from the MC 20 and a DI signal which is an acknowledgment signal for the DO signal.

The rise delay time counter 45 measures a time difference at the rise of the DO signal and the DI signal. The fall delay time counter 46 measures a time difference at the fall of the DO signal and the DI signal.

Each of the rise delay time counter 45 and the fall delay time counter 46 is set to 16 bits each, starts counting by a START command controlled by the MC software of the MC 20, and stops the counting a STOP command. Reading of the counter values of the rise delay time counter 45 and the fall delay time counter 46 is possible even during counting.

Abnormality Detection Process

An abnormality detection process according to the second embodiment illustrated in FIG. 19 is executed by the MC 20. As a premise, the controller 26 measures in advance the value of a reference delay time $\Delta t_a$ at the rise of a DO signal (RF ON DO) and a DI signal (RF ON DI) when the RF power supply 18 is normally operating, and the value of a reference delay time $\Delta t_b$ at the fall of the ON DO signal and the RF ON DI signal.

Before this process is performed, the controller 26 acquires the value of the reference delay time $\Delta t_a$ at the rise and the value of the reference delay time $\Delta t_b$ at the fall. Next, when this process is started, the communication unit 25 acquires, from the communication unit 36 of the I/O board 30, the rise delay time S(n) (=$\Delta t_a$n:1≤n) (step S62). Further, the communication unit 25 acquires, from the communication unit 36 of the I/O board 30, the fall delay time U(n) ($\Delta t_b$n:1≤n) stored in the fall delay time counter 46 (step S62). As a result, the rise delay time S(n) and the fall delay time U(n) illustrated in FIG. 20 are acquired.

Next, the abnormality determination unit 27 compares the rise delay time S(n) (=$\Delta t_a$n) with the value of the reference delay time $\Delta t_a$, and also compares the fall delay time U(n) (=$\Delta t_b$n) with the value of the reference delay time $\Delta t_b$ (step S64). Each of the rise delay time counter 45 and the fall delay time counter 46 is a 16-bit counter. $\Delta t_a$ and $\Delta t_b$ may be counted up to 0.1 ms×$2^{16}$=6.5 seconds and a sufficient count time is secured.

As a result of the comparison, the abnormality determination unit 27 determines whether any one rise delay time S(n) or any one fall delay time U(n) deviates beyond an allowable range (step S66). When it is determined that any one rise delay time S(n) or any one fall delay time U(n) deviates beyond an allowable range, the abnormality determination unit 27 determines that there is an abnormality in the I/O board 30 or the RF power supply 18 (step S68), and terminates the present process. Meanwhile, when it is determined that any one rise delay time S(n) or any one fall delay U(n) does not deviate beyond an allowable range, the abnormality determination unit 27 determines that there is no abnormality in the RF power supply 18 (step S70), and terminates the process.

As described above, according to the abnormality detection system of the sixth embodiment, it is possible to accurately detect an abnormality in the RF power supply 18 or the I/O board 30 based on the rise delay time or the fall delay time of the RF ON DO signal and the RF ON DI signal.

Although the abnormality detection system and the control board have been described in the above embodiments, the abnormality detection system and the control board according to the present disclosure are not limited to the above embodiments, and various modifications and improvements can be made within the scope of the present disclosure. The matters described in the above-described plural embodiments may be combined as long as they do not contradict.

For example, when it is determined that a device such as the RF power supply 18 is abnormal, the MC 20 may record the status information of the device as log information. Thus, when designing and building a process to be executed by the substrate processing apparatus 10, it is possible to prevent a process defect in advance using the log information.

The abnormality of the RF power supply 18 includes degradation and breakage of the RF power supply 18. In addition, the abnormality of the I/O board 30 includes a possibility of a trouble of the I/O board 30. Therefore, the MC 20 may differently handle respective devices determined to be abnormal. For example, when it is determined that the RF power supply 18 is abnormal, the process may be stopped when the number of times that the RF power supply 18 is determined to be abnormal exceeds a predetermined number of times, for example, three times or more. When it is determined that the I/O board 30 is abnormal, the input/output of a signal from the I/O board 30 may be stopped immediately, regardless of the number of times that the I/O board 30 is determined to be abnormal.

Further, the substrate processing apparatus according to the present disclosure may be applied not only to a capacitively coupled plasma (CCP) apparatus, but also to other substrate processing apparatuses. Other substrate processing apparatuses may be, for example, an inductively coupled plasma (ICP) apparatus, a plasma processing apparatus using a radial line slot antenna, a helicon wave plasma (HWP) apparatus, or an electron cyclotron resonance (ECR) plasma apparatus.

In the present specification, a semiconductor wafer W has been described as a substrate to be film-formed. However, the substrate is not limited thereto, and may be, for example, various substrates used for, for example, a liquid crystal display (LCD) and a flat panel display (FPD), a photomask, a CD substrate, or a printed circuit board.

DESCRIPTION OF SYMBOLS

1: EC
2: network
10: substrate processing apparatus
11: processing container
14: gas supply source
16: exhaust device
17: matcher
18: RF power supply
19: stage
20: MC
21: I/O control interface
22: CPU
23: volatile memory
24: nonvolatile memory
25: communication unit
26: controller
27: abnormality determination unit
28: log storage unit
30: I/O board
31: I/O module
32: CPU
33: RAM
34: FPGA
35: status signal detection circuit
36: communication unit
37: storage unit
38: clocking unit
39: device controller
40: DO counter
41: DI counter
42: maximum value register
43: minimum value register
44: integration register
45: rise delay time counter
46: fall delay time counter
48: network
50: photocoupler
51: AI circuit

What is claimed is:

1. A substrate processing apparatus with an abnormality detection system, comprising:
    a processing container; and
    a gas supply source configured to supply a plurality of gases into the processing container, and
    the abnormality detection system including:
        a first controller configured to control the substrate processing apparatus and serve as a high-level controller; and
        a second controller including a memory, and configured to control a device provided in the substrate processing apparatus according to an instruction from the first controller and serve as a low-level controller, the device including a high-frequency power supply and a matcher,
        wherein the second controller is configured to:
            collect a status signal for the device at a predetermined sampling interval for a predetermined time period in a predetermined collecting cycle, the status signal for the device including a signal of a matching position of the matcher, and
            accumulate the status signal for the device in the memory, and the first controller that serves as the high-level controller includes an abnormality determination circuitry configured to:
        acquire accumulated status signals for the device from the memory of the second controller that serves as the low-level controller at a time interval equal to or longer than the predetermined time period during which the second controller collects the status signals for the device at the predetermined sampling interval, the time interval being longer than the predetermined sampling interval, and
        determine presence or absence of an abnormality in the device based on the status signals for the device including a peak value, a median value and an average value of the signal of the matching position of the matcher.

2. The substrate processing apparatus with the abnormality detection system of claim 1, wherein the second controller accumulates, in the memory, at least one of: the number of command signals to the high-frequency power supply; the number of acknowledgment signals for the command signals; a signal of power of a high-frequency traveling wave output from the high-frequency power supply; a signal of power of a high-frequency reflected wave; a signal of voltage of the high-frequency traveling wave; the signal of the matching position of the matcher; a signal indicating an integrated value of the power of the high-frequency traveling wave; a signal indicating a rise delay time of the command signals to the high power supply and the acknowledgment signals for the command signals; and a signal indicating a fall delay time of the command signals to the high-frequency power supply and the acknowledgment signals for the command signals.

3. The substrate processing apparatus with the abnormality detection system of claim 2, wherein the abnormality determination circuitry determines presence or absence of an abnormality in the high-frequency power supply based on at least one of: a peak value, a median value, and an average value of each of the signal of the power of the high-frequency traveling wave, the signal of the power of the high-frequency reflected wave, the signal of the voltage of the high-frequency traveling wave, and the signal of the matching position of the matcher; and an integrated power value indicated by a signal of an integrated value of the power of the high-frequency traveling wave.

4. The substrate processing apparatus with the abnormality detection system of claim 2, wherein the abnormality determination circuitry determines presence or absence of an abnormality in the high-frequency power supply, an abnormality in the matcher, or an abnormality in wiring between the high-frequency power supply and the matcher based on at least one of the number of command signals to the high-frequency power supply and the number of acknowledgment signals for the command signals.

5. The substrate processing apparatus with the abnormality detection system of claim 2, wherein the abnormality determination circuitry determines presence or absence of an abnormality in the high-frequency power supply or an abnormality in the matcher based on at least one of a delay time indicated by the signal of the rise delay time of the command signals to the high-frequency power supply and the acknowledgment signals for the command signals, and a delay time indicated by the signal of the fall delay time of the command signals to the high-frequency power supply and the acknowledgment signals for the command signals.

6. The substrate processing apparatus with the abnormality detection system of claim 1, further comprising:
a log memory configured to store log information of the status signal of the device when the abnormality determination circuitry determines that there is an abnormality in the device.

7. The substrate processing apparatus with the abnormality detection system of claim 1, wherein the substrate processing apparatus is an ALD apparatus configured to perform a film formation processing on the substrate through an ALD method.

8. A first controller serving as a high-level controller and configured to determine, based on a status signal of a device provided in a substrate processing apparatus, presence or absence of an abnormality in the device, so as to control the device, the status signal of the device being sent from a control board serving as a low-level controller,
wherein the substrate processing apparatus includes:
a processing container; and
a gas supply source configured to supply a plurality of gases into the processing container,
wherein the control board includes a memory and a transceiver, and is configured to collect the status signal of the device at a predetermined sampling interval for a predetermined time period in a predetermined collecting cycle and accumulate the status signal of the device in the memory, the device including a high-frequency power supply and a matcher, and the status signal for the device including a signal of a matching position of the matcher; and
the transceiver of the control board is configured to transmit accumulated status signals of the device in the memory of the control board that serves as the low-level controller to the first controller that serves as the high-level controller according to polling transmitted by the first controller at a time interval equal to or longer than the predetermined time period during which the control board collects the status signal of the device at the predetermined sampling interval, the time interval being longer than the predetermined sampling interval.

9. The substrate processing apparatus with the abnormality detection system of claim 1, wherein the predetermined time period ranges from 50 ms to 100 ms, the predetermined sampling interval ranges from 300 µs to 1 ms, and the predetermined collecting cycle ranges from 200 ms to 800 ms.

10. The first controller of claim 8, wherein the predetermined time period ranges from 50 ms to 100 ms, the predetermined sampling interval ranges from 300 µs to 1 ms, and the predetermined collecting cycle ranges from 200 ms to 800 ms.

11. The substrate processing apparatus with the abnormality detection system of claim 1, wherein the time interval at which the abnormality determination circuitry of the first controller acquires the accumulated status signals for the device is 100 ms.

12. The first controller of claim 8, wherein the time interval at which the abnormality determination circuitry of the first controller acquires the accumulated status signals for the device is 100 ms.

* * * * *